(12) United States Patent
Chun et al.

(10) Patent No.: US 10,454,056 B1
(45) Date of Patent: Oct. 22, 2019

(54) ORGANIC LIGHT EMITTING DEVICE

(71) Applicant: LG CHEM, LTD., Seoul (KR)

(72) Inventors: Min Seung Chun, Daejeon (KR); Sang Young Jeon, Daejeon (KR); Boon Jae Jang, Daejeon (KR); Minwoo Choi, Daejeon (KR); Hyeon Soo Jeon, Daejeon (KR)

(73) Assignee: LG CHEM, LTD., Seoul (KR)

( * ) Notice: Subject to any disclaimer, the term of this patent is extended or adjusted under 35 U.S.C. 154(b) by 0 days.

(21) Appl. No.: 16/317,444

(22) PCT Filed: Jan. 3, 2018

(86) PCT No.: PCT/KR2018/000121
§ 371 (c)(1),
(2) Date: Jan. 11, 2019

(87) PCT Pub. No.: WO2018/182145
PCT Pub. Date: Oct. 4, 2018

(30) Foreign Application Priority Data

Mar. 30, 2017 (KR) .................... 10-2017-0040552

(51) Int. Cl.
*H01L 51/42* (2006.01)
*H01L 51/50* (2006.01)
*C09K 11/06* (2006.01)
*H01L 51/00* (2006.01)
*H01L 51/52* (2006.01)

(52) U.S. Cl.
CPC .......... *H01L 51/5072* (2013.01); *C09K 11/06* (2013.01); *H01L 51/0045* (2013.01); *H01L 51/0059* (2013.01); *H01L 51/5056* (2013.01); *H01L 51/5203* (2013.01)

(58) Field of Classification Search
CPC ............. H01L 51/5072; H01L 51/5056; H01L 51/5203; H01L 51/0045; H01L 51/0059; C09K 11/06
See application file for complete search history.

(56) References Cited

U.S. PATENT DOCUMENTS

| | | | |
|---|---|---|---|
| 2004/0251816 A1 | 12/2004 | Leo et al. | |
| 2011/0309344 A1 | 12/2011 | Watanabe et al. | |
| 2014/0299192 A1* | 10/2014 | Lee | C07D 403/10 136/263 |
| 2015/0318508 A1 | 11/2015 | Kim et al. | |
| 2015/0380662 A1 | 12/2015 | Kim et al. | |
| 2016/0141511 A1* | 5/2016 | Kim | H01L 51/0067 257/40 |
| 2016/0164002 A1 | 6/2016 | Parham et al. | |
| 2016/0380208 A1 | 12/2016 | La et al. | |
| 2017/0077414 A1 | 3/2017 | Kim et al. | |

(Continued)

FOREIGN PATENT DOCUMENTS

| | | |
|---|---|---|
| JP | 2017175128 A | 9/2017 |
| KR | 10-2000-0051826 A | 8/2000 |

(Continued)

*Primary Examiner* — Ahmed N Sefer
(74) *Attorney, Agent, or Firm* — Dentons US LLP

(57) ABSTRACT

The present invention provides an organic light emitting device including a light emitting layer comprising a compound represented by Chemical Formula 1 and an electron transport layer comprising a compound represented by Chemical Formula 2, and having improved driving voltage and efficiency.

9 Claims, 1 Drawing Sheet

(56) References Cited

U.S. PATENT DOCUMENTS

| | | |
|---|---|---|
| 2017/0084849 A1 | 3/2017 | Tsai et al. |
| 2017/0186965 A1 | 6/2017 | Parham et al. |
| 2017/0271610 A1 | 9/2017 | Takahashi et al. |
| 2017/0279055 A1 | 9/2017 | Jang et al. |
| 2018/0037546 A1 | 2/2018 | Sugino et al. |
| 2018/0301636 A1 | 10/2018 | Park et al. |

FOREIGN PATENT DOCUMENTS

| | | |
|---|---|---|
| KR | 10-2014-0009918 A | 1/2014 |
| KR | 10-2017-0033482 A | 3/2014 |
| KR | 10-2014-0091487 A | 7/2014 |
| KR | 10-2015-0077271 A | 7/2015 |
| KR | 10-2015-0126755 A | 11/2015 |
| KR | 10-2016-0003362 A | 1/2016 |
| KR | 10-2016-0038006 A | 4/2016 |
| KR | 10-2017-0001552 A | 1/2017 |
| KR | 10-2017-0073567 A | 6/2017 |
| TW | 201609675 A | 3/2016 |
| WO | 03012890 A2 | 2/2003 |
| WO | 20150170882 A1 | 11/2015 |
| WO | 2016129672 A1 | 8/2016 |

\* cited by examiner

[FIG. 1]

| 6 |
|---|
| 5 |
| 4 |
| 3 |
| 2 |
| 1 |

[FIG. 2]

| 6 |
|---|
| 8 |
| 5 |
| 4 |
| 3 |
| 7 |
| 2 |
| 1 |

ORGANIC LIGHT EMITTING DEVICE

CROSS-REFERENCE TO RELATED APPLICATION(S)

This application is a National Stage Entry of International Application No. PCT/KR2018/000121, filed on Jan. 3, 2018, and claims the benefit of and priority to Korean Application No. 10-2017-0040552, filed on Mar. 30, 2017, all of which are hereby incorporated by reference in their entirety for all purposes as if fully set forth herein

TECHNICAL FIELD

The present invention relates to an organic light emitting device having improved driving voltage and efficiency.

BACKGROUND ART

In general, an organic light emitting phenomenon refers to a phenomenon where electric energy is converted into light energy by using an organic material. The organic light emitting device using the organic light emitting phenomenon has characteristics such as a wide viewing angle, an excellent contrast, a fast response time, an excellent luminance, driving voltage and response speed, and thus many studies have proceeded.

The organic light emitting device generally has a structure which comprises an anode, a cathode, and an organic material layer interposed between the anode and the cathode. The organic material layer frequently have a multilayered structure that comprises different materials in order to enhance efficiency and stability of the organic light emitting device, and for example, the organic material layer may be formed of a hole injection layer, a hole transport layer, a light emitting layer, an electron transport layer, an electron injection layer and the like. In the structure of the organic light emitting device, if a voltage is applied between two electrodes, the holes are injected from an anode into the organic material layer and the electrons are injected from the cathode into the organic material layer, and when the injected holes and the electrons meet each other, an exciton is formed, and light is emitted when the exciton falls to a ground state again.

With respect to the organic light emitting device as described above, there is a continuing demand for developing an organic light emitting device having improved driving voltage and efficiency.

PRIOR ART LITERATURE

Patent Literature (Patent Literature 1) Korean Patent Laid-open Publication No. 10-2000-0051826

DETAILED DESCRIPTION OF THE INVENTION

Technical Problem

It is one object of the present invention to provide an organic light emitting device having improved driving voltage and efficiency.

Technical Solution

The present invention provides an organic light emitting device comprising:

a first electrode;
a hole transport layer;
a light emitting layer;
an electron transport layer; and
a second electrode,
wherein the light emitting layer comprises a compound represented by Chemical Formula 1 below and the electron transport layer comprises a compound represented by Chemical Formula 2 below:

[Chemical Formula 1]

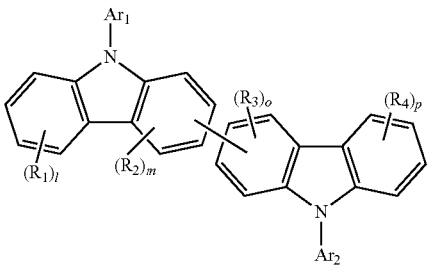

in Chemical Formula 1,
$Ar_1$ and $Ar_2$ are the same as or different from each other, and each independently, represent a substituted or unsubstituted $C_{6-60}$ aryl,
l and p are each independently an integer of 0 to 4,
m and o are each independently an integer of 0 to 2,
$R_1$ to $R_4$ are the same as or different from each other, and each independently represent hydrogen; a substituted or unsubstituted $C_{6-60}$ aryl; or $C_{2-60}$ heteroaryl containing one or more heteroatoms each independently selected from the group consisting of N, O and S; or $R_1$ and $R_2$, or $R_3$ and $R_4$ bond to each other to form a substituted or unsubstituted $C_{6-60}$ aromatic ring,

[Chemical Formula 2]

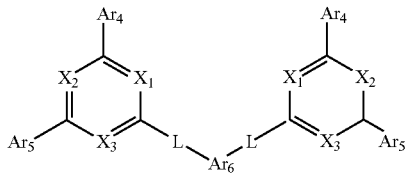

in Chemical Formula 2,
$X_1$ to $X_3$ are the same as or different from each other, and each independently represent N, or CH, provided that at least one of $X_1$ to $X_3$ is N,
$Ar_4$ and $Ar_5$ are the same as or different from each other, and each independently represent a substituted or unsubstituted $C_{6-60}$ aryl; or $C_{2-60}$ heteroaryl containing one or more heteroatoms each independently selected from the group consisting of N, O and S;
each L is independently the same as or different from each other, and each independently represent a substituted or unsubstituted $C_{6-60}$ arylene; or $C_{2-60}$ heteroarylene containing one or more heteroatoms each independently selected from t group consisting of N, O, S and P, and
$Ar_6$ is a substituted or unsubstituted $C_{6-60}$ arylene; or $C_{2-60}$ heteroarylene containing one or more heteroatoms each independently selected from the group consisting of N, O and S.

Advantageous Effects

The organic light emitting device described above is excellent in driving voltage and efficiency.

BRIEF DESCRIPTION OF DRAWINGS

FIG. 1 shows an example of an organic light emitting device comprising a substrate 1, an anode 2, a hole transport layer 3, a light emitting layer 4, an electron transport layer 5, and a cathode 6.

FIG. 2 shows an example of an organic light emitting device comprising a substrate 1, an anode 2, a hole injection layer 7, a hole transport layer 3, a light emitting layer 4, an electron transport layer 5, an electron injection layer 8, and a cathode 6.

DETAILED DESCRIPTION OF THE EMBODIMENTS

Hereinafter, the present invention will be described in more detail to help understanding of the present invention.

In the present specification,

means a bond connected to another substituent group.

As used herein, the term "substituted or unsubstituted" means that substitution is performed by one or more substituent groups selected from the group consisting of deuterium; a halogen group; a nitrile group; a nitro group; a hydroxyl group; a carbonyl group; an ester group; an imide group; an amino group; a phosphine oxide group; an alkoxy group; an aryloxy group; an alkylthioxy group; an arylthioxy group; an alkylsulfoxy group; an arylsulfoxy group; a silyl group; a boron group; an alkyl group; a cycloalkyl group; an alkenyl group; an aryl group; an aralkyl group; an aralkenyl group; an alkylaryl group; an alkylamine group; an aralkylamine group: a heteroarylamine group; an arylamine group; an arylphosphine group; or a heterocyclic group containing at least one of N, O, and S atoms, or there is no substituent group, or substitution is performed by a substituent group where two or more substituent groups of the exemplified substituent groups are linked or there is no substituent group. For example, the term "substituent group where two or more substituent groups are linked" may be a biphenyl group. That is, the biphenyl group may be an aryl group, or may be interpreted as a substituent group where two phenyl groups are linked.

In the present specification, the number of carbon atoms in a carbonyl group is not particularly limited, but is preferably 1 to 40 carbon atoms. Specifically, the carbonyl group may be compounds having the following structures, but is not limited thereto.

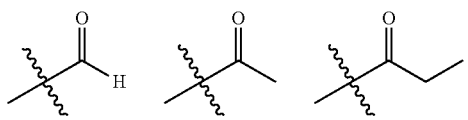

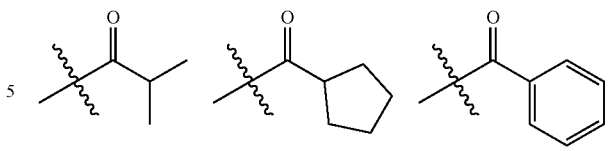

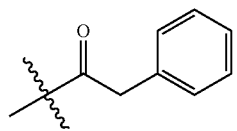

In the present specification, the ester group may have a structure in which oxygen of the ester group may be substituted by a straight-chain, branched-chain, or cyclic alkyl group having 1 to 25 carbon atoms, or an aryl group having 6 to 25 carbon atoms. Specifically, the ester group may be compounds having the following structures, but is not limited thereto.

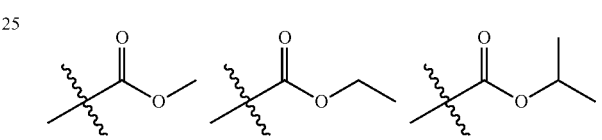

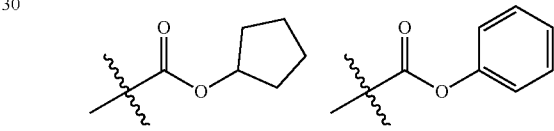

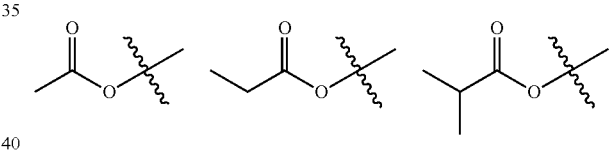

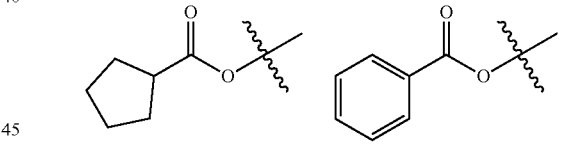

In the present specification, the number of carbon atoms in an imide group is not particularly limited, but is preferably 1 to 25. Specifically, the imide group may be compounds having the following structures, but is not limited thereto.

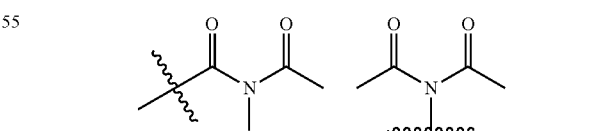

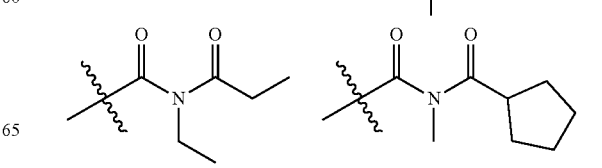

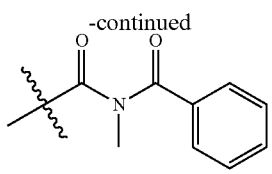

In the present specification, the silyl group specifically includes a trimethylsilyl group, a triethylsilyl group, a t-butyldimethylsilyl group, a vinyldimethylsilyl group, a propyldimethylsilyl group, a triphenylsilyl group, a diphenylsilyl group, a phenylsilyl group, and the like, but is not limited thereto.

In the present specification, the boron group specifically includes a trimethylboron group, a triethylboron group, a t-butyldimethylboron group, a triphenylboron group, a phenylboron group, and the like, but is not limited thereto.

In the present specification, examples of a halogen group include fluorine, chlorine, bromine, or iodine.

In the present specification, an alkyl group may be a straight chain or a branched chain, and the number of carbon atoms thereof is not particularly limited, but is preferably 1 to 40. According to one embodiment, the alkyl group has 1 to 20 carbon atoms. According to another embodiment, the alkyl group has 1 to 10 carbon atoms. According to still another embodiment; the alkyl group has 1 to 6 carbon atoms. Specific examples of the alkyl group include methyl, ethyl, propyl, n-propyl, isopropyl, butyl, n-butyl, isobutyl, tert-butyl, sec-butyl, 1-methyl-butyl, 1-ethyl-butyl, pentyl, n-pentyl, isopentyl, neopentyl, tert-pentyl, hexyl, n-hexyl, 1-methylpentyl, 2-methylpentyl, 4-methyl-2-pentyl, 3,3-dimethylbutyl, 2-ethylbutyl, heptyl, n-heptyl, 1-methylhexyl, cyclopentylmethyl, cyclohexylmethyl, octyl, n-octyl, tert-octyl, 1-methylheptyl, 2-ethylhexyl, 2-propylpentyl, n-nonyl, 2,2-dimethylheptyl, 1-ethyl-propyl, 1,1-dimethylpropyl, isohexyl, 2-methylpentyl, 4-methylhexyl, 5-methylhexyl, and the like, but are not limited thereto.

In the present specification, the alkenyl group may be a straight chain or a branched chain, and the number of carbon atoms thereof is not particularly limited, but is preferably 2 to 40. According to one embodiment, the alkenyl group has 2 to 20 carbon atoms. According to another embodiment, the alkenyl group has 2 to 10 carbon atoms. According to still another embodiment; the alkenyl group has 2 to 6 carbon atoms. Specific examples thereof include vinyl, 1-propenyl, isopropenyl, 1-butenyl, 2-butenyl, 3-butenyl, 1-pentenyl, 2-pentenyl, 3-pentenyl, 3-methyl-1-butenyl, 1,3-butadienyl, allyl, 1-phenylvinyl-1-yl, 2-phenylvinyl-1-yl, 2,2-diphenylvinyl-1-yl, 2-phenyl-2-(naphthyl-1-yl)vinyl-1-yl, 2,2-bis(diphenyl-1-yl)vinyl-1-yl, a stilbenyl group, a styrenyl group, and the like, but are not limited thereto.

In the present specification, a cycloalkyl group is not particularly limited, but the number of carbon atoms thereof is preferably 3 to 60. According to one embodiment, the cycloalkyl group has 3 to 30 carbon atoms. According to another embodiment, the cycloalkyl group has 3 to 20 carbon atoms. According to another embodiment, the cycloalkyl group has 3 to 6 carbon atoms. Specific examples thereof include cyclopropyl, cyclobutyl, cyclopentyl, 3-methylcyclopentyl, 2,3-dimethylcyclopentyl, cyclohexyl, 3-methylcyclohexyl, 4-methylcyclohexyl, 2,3-dimethylcyclohexyl, 3,4,5-trimethylcyclohexyl, 4-tert-butylcyclohexyl, cycloheptyl, cyclooctyl, and the like, but are not limited thereto.

In the present specification, the aryl group is not particularly limited, but preferably has 6 to 60 carbon atoms, and may be a monocyclic aryl group or a polycyclic aryl group. According to one embodiment, the aryl group has 6 to 30 carbon atoms. According to one embodiment, the aryl group has 6 to 20 carbon atoms. The aryl group may be a phenyl group, a biphenyl group, a terphenyl group or the like as the monocyclic aryl group, but is not limited thereto. Examples of the polycyclic aryl group include a naphthyl group, an anthracenyl group, a phenanthryl group, a pyrenyl group, a perylenyl group, a chrysenyl group, a fluorenyl group or the like, but is not limited thereto.

In the present specification, a fluorenyl group may be substituted, and two substituent groups may be linked with each other to form a Spiro structure. In the case where the fluorenyl group is substituted,

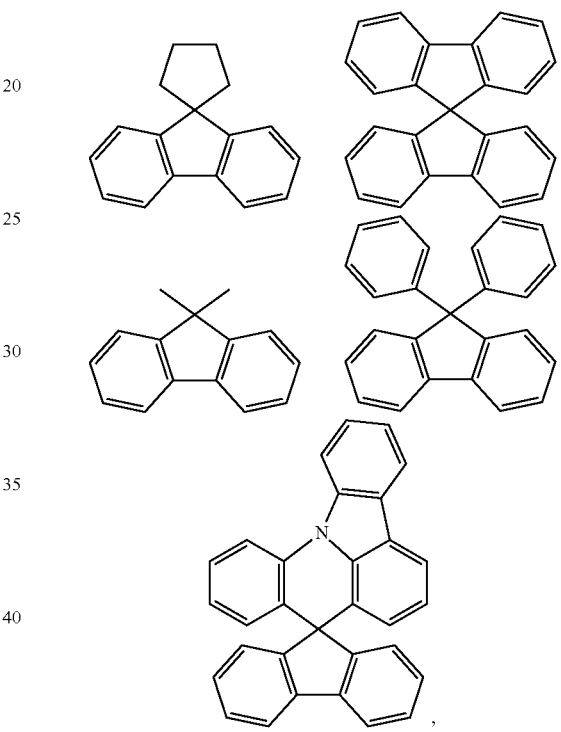

and the like can be formed. However, the structure is not limited thereto.

In the present specification, the heterocyclic group is a heterocyclic group containing at least one of O, N, Si and S as a heteroatom, and the number of carbon atoms thereof is not particularly limited, but is preferably 2 to 60. Examples of the heterocyclic group include a thiophene group, a furan group, a pyrrole group, an imidazole group, a thiazole group, an oxazole group, an oxadiazole group, a triazole group, a pyridyl group, a bipyridyl group, a pyrimidyl group, a triazine group, an acridyl group, a pyridazine group, a pyrazinyl group, a quinolinyl group, a quinazoline group, a quinoxalinyl group, a phthalazinyl group, a pyridopyrimidinyl group, a pyridopyrazinyl group, a pyrazinopyrazinyl group, an isoquinoline group, an indole group, a carbazole group, a benzoxazole group, a benzimidazole group, a benzothiazole group, a benzocarbazole group, a benzothiophene group, a dibenzothiophene group, a benzofuranyl group, a phenanthroline group, an isoxazolyl group, a thiadiazolyl group, a phenothiazinyl group, a dibenzofuranyl group, and the like, but are not limited thereto.

In the present specification, the aryl group in the aralkyl group, the aralkenyl group, the alkylaryl group, and the arylamine group is the same as the aforementioned examples of the aryl group. In the present specification, the alkyl group in the aralkyl group, the alkylaryl group and the alkylamine group is the same as the aforementioned examples of the alkyl group. In the present specification, the heteroaryl in the heteroarylamines can be applied to the aforementioned description of the heterocyclic group. In the present specification, the alkenyl group in the aralkenyl group is the same as the aforementioned examples of the alkenyl group. In the present specification, the aforementioned description of the aryl group may be applied except that the arylene is a divalent group. In the present specification, the aforementioned description of the heterocyclic group can be applied except that the heteroarylene is a divalent group. In the present specification, the aforementioned description of the aryl group or cycloalkyl group can be applied except that the hydrocarbon ring is not a monovalent group but formed by combining two substituent groups. In the present specification, the aforementioned description of the heterocyclic group can be applied, except that the heterocycle is not a monovalent group but formed by combining two substituent groups.

The present invention provides the following organic light emitting device:

An organic light emitting device comprising: a first electrode; a hole transport layer; a light emitting layer; an electron transport layer; and a second electrode, wherein the light emitting layer includes a compound represented by Chemical Formula 1 and the electron transport layer includes a compound represented by Chemical Formula 2.

The organic light emitting device according to the present invention has a feature that by adjusting materials contained in the light emitting layer and the electron transport layer and adjusting the energy level between the respective layers, the driving voltage can be lowered and thus the efficiency can be improved. In particular, in the case where there is an aryl group containing a plurality of independent heteroatoms in which a LUMO orbital exists mainly on a linker, as in the compound represented by Chemical Formula 2, there are advantages in that its ability to donate electrons is improved, the electron mobility or electron density for bulk increases, the overall conductivity increases, and thereby the driving voltage of the device is lowered, as compared with a compound having an aryl group containing a single heteroatom.

Hereinafter, the present invention will be described in detail for each configuration.

First Electrode and Second Electrode

The first electrode and second electrode used in the present invention are electrodes used in an organic light emitting device. For example, the first electrode is an anode and the second electrode is a cathode, or the first electrode is a cathode and the second electrode is an anode.

As the anode material, generally, a material having a large work function is preferably used so that holes can be smoothly injected into the organic material layer. Specific examples of the anode material include metals such as vanadium, chrome, copper, zinc, and gold, or an alloy thereof; metal oxides such as zinc oxides, indium oxides, indium tin oxides (ITO), and indium zinc oxides (IZO); a combination of metals and oxides, such as ZnO:Al or $SNO_2$:Sb; conductive polymers such as poly(3-methylthiophene), poly[3,4-(ethylene-1,2-dioxy)thiophene](PEDOT), polypyrrole, and polyaniline, and the like, but are not limited thereto.

As the cathode material, generally, a material having a small work function is preferably used so that electrons can be easily injected into the organic material layer. Specific examples of the cathode material include metals such as magnesium, calcium, sodium, potassium, titanium, indium, yttrium, lithium, gadolinium, aluminum, silver, tin, and lead, or an alloy thereof; a multilayered structure material such as LiF/Al or $LiO_2$/Al, and the like, but are not limited thereto.

In addition, a hole injection layer may be further included on the anode. The hole injection layer is composed of a hole injection material, and the hole injection material is preferably a compound which has an ability of transporting the holes, a hole injection effect in the anode and an excellent hole injection effect to the light emitting layer or the light emitting material, prevents movement of an exciton generated in the light emitting layer to the electron injection layer or the electron injection material, and has an excellent thin film forming ability.

It is preferable that a HOMO (highest occupied molecular orbital) of the hole injection material is between the work function of the anode material and a HOMO of a peripheral organic material layer. Specific examples of the hole injection material include metal porphyrine, oligothiophene, an arylamine-based organic material, a hexanitrilehexaazatriphenylene-based organic material, a quinacridone-based organic material, a perylene-based organic material, anthraquinone, polyaniline and polythiophene-based conductive polymer, and the like, but are not limited thereto.

Hole Transport Layer

The hole transport layer used in the present invention is a layer that receives holes from an anode or a hole injection layer formed on the anode and transports the holes to the light emitting layer.

The hole transport material is suitably a material having large mobility to the holes, which may receive holes from the anode or the hole injection layer and transfer the holes to the light emitting layer. Specific examples thereof include an arylamine-based organic material, a conductive polymer, a block copolymer in which a conjugate portion and a non-conjugate portion are present together, and the like, but are not limited thereto.

Light Emitting Layer

The light emitting layer used in the present invention means a layer that emits light in the visible light region by combining holes and electrons respectively transported from the hole transport layer and the electron transport layer.

In particular, the light emitting layer according to the present invention includes a compound represented by Chemical Formula 1. The compound represented by Chemical Formula 1 functions as a host of the light emitting layer.

Preferably, $Ar_1$ and $Ar_2$ are the same as or different from each other, and each independently represent phenyl, biphenylyl, naphthyl, phenanthrenyl, or terphenyl.

Preferably, $R_1$ to $R_4$ are the same as or different from each other, and each independently represent hydrogen, or carbazolyl substituted with phenyl.

Preferably, the compound represented by Chemical Formula 1 is any one selected from the group consisting of:

1-1
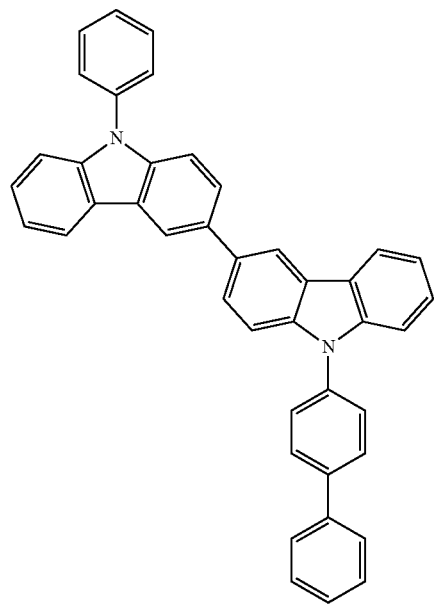
1-2
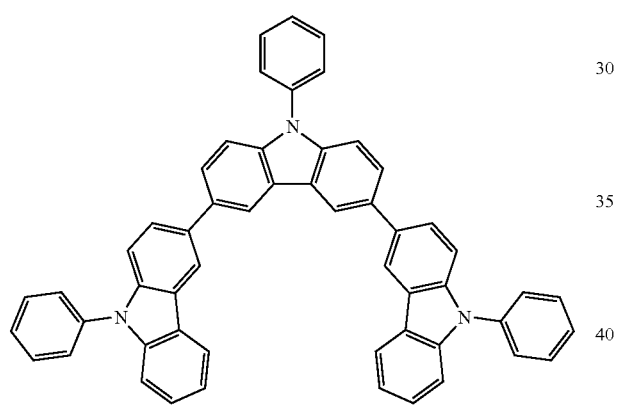
1-3
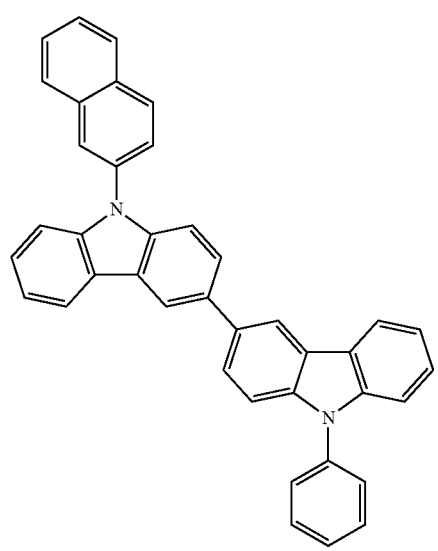
1-4
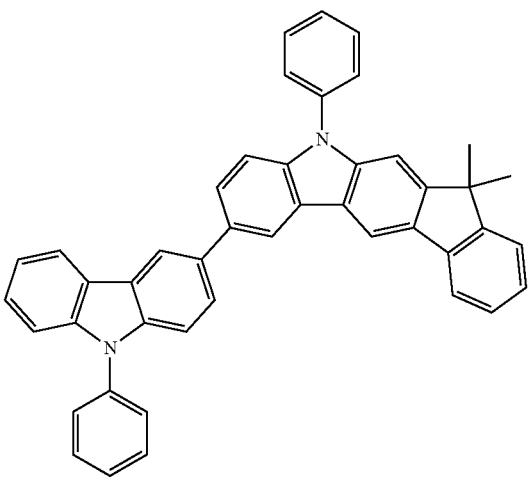
1-5
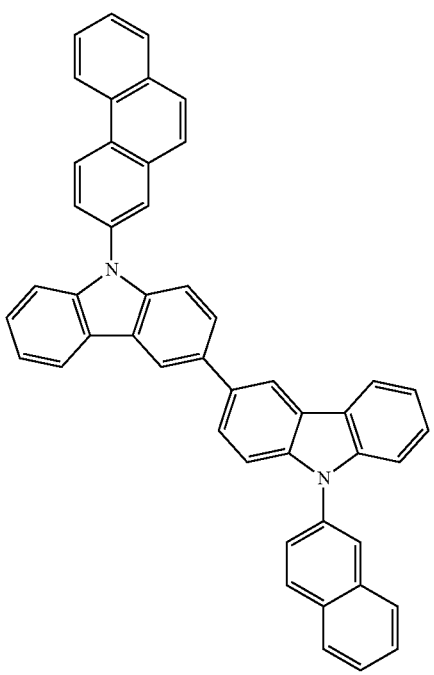

1-6
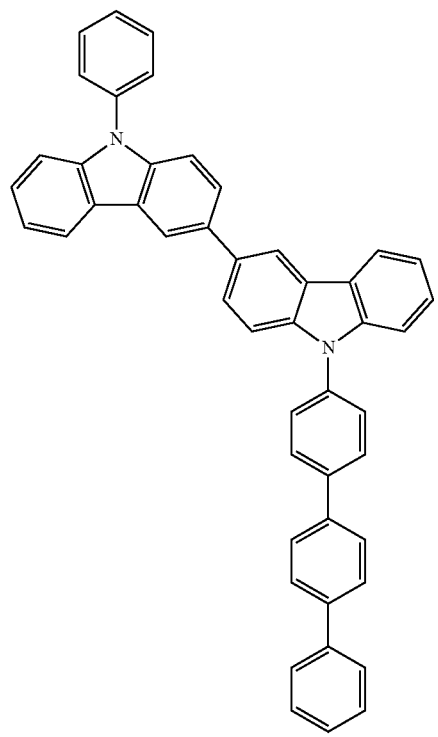
1-7
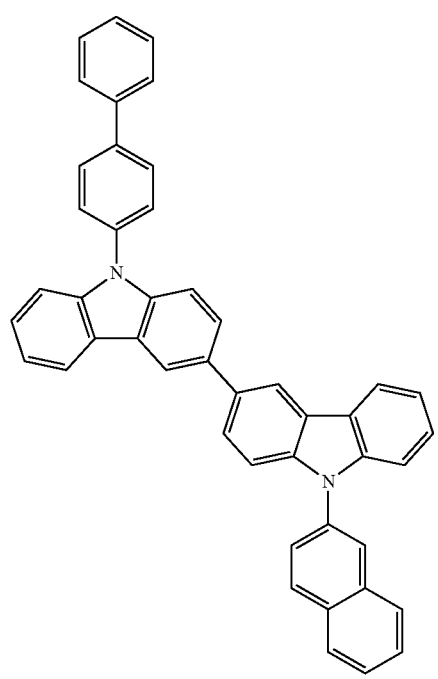
1-8
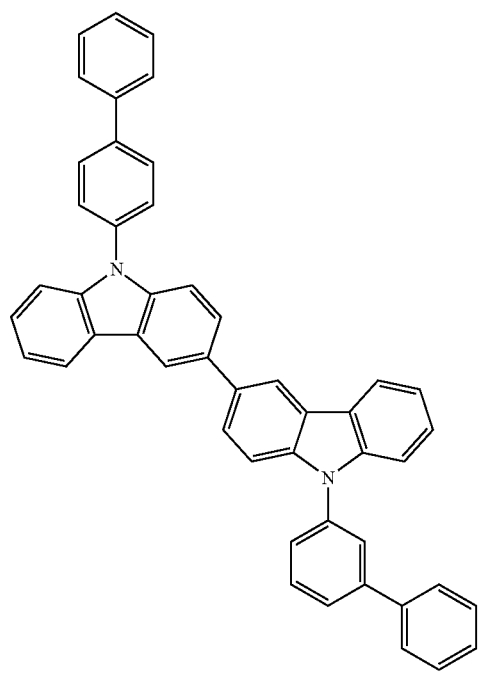
1-9

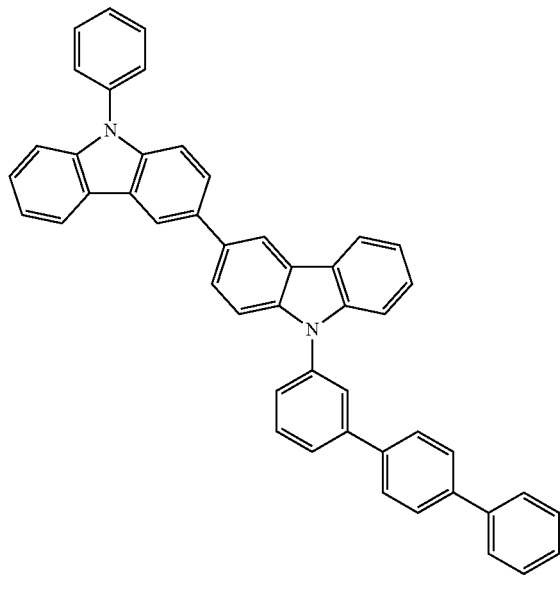
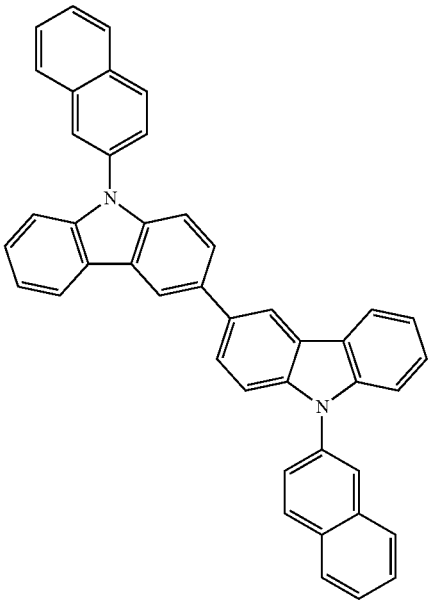

The compound represented by Chemical Formula 1 can be prepared, by a preparation method as shown in the following Reaction Scheme 1. The preparation method can be further specified in Preparation Examples to be described later.

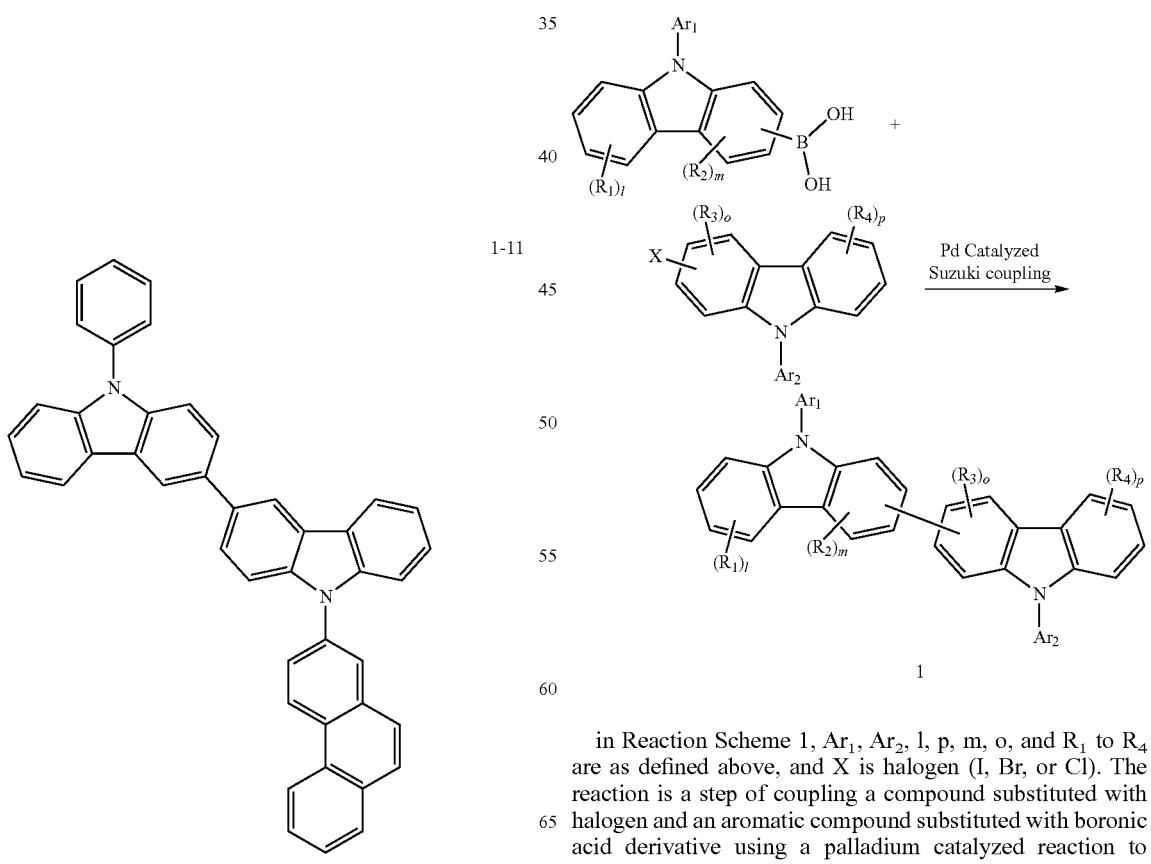

in Reaction Scheme 1, $Ar_1$, $Ar_2$, l, p, m, o, and $R_1$ to $R_4$ are as defined above, and X is halogen (I, Br, or Cl). The reaction is a step of coupling a compound substituted with halogen and an aromatic compound substituted with boronic acid derivative using a palladium catalyzed reaction to prepare a compound represented by Chemical Formula 1.

The preparation method can be further specified in Preparation Examples to be described later.

The light emitting layer includes a dopant in addition to the compound represented by Chemical Formula 1. The dopant includes an aromatic amine derivative, a styrylamine compound, a boron complex, a fluoranthene compound, a metal complex, and the like. Specifically, the aromatic amine derivative is a condensed aromatic cycle derivative having a substituted or unsubstituted arylamino group, examples thereof include pyrene, anthracene, chrysene, and periflanthene having the arylamino group, and the like, the styrylamine compound is a compound where at least one arylvinyl group is substituted in substituted or unsubstituted arylamine, in which one or two or more substituent groups selected from the group consisting of an aryl group, a silyl group, an alkyl group, a cycloalkyl group, and an arylamino group are substituted or unsubstituted. Specific examples thereof include styrylamine, styryldiamine, styryltriamine, styryltetramine, and the like, but are not limited thereto.

Further, examples of the metal complex include an iridium complex, a platinum complex, and the like, but are not limited thereto.

Electron Transport Layer

The electron transport layer used in the present invention is a layer that receives electrons from a cathode or an electron injection layer formed on the cathode and transports the electrons to the light emitting layer.

In particular, the electron transport layer according to the present invention includes a compound represented by Chemical Formula 2.

Preferably, $X_1$ to $X_3$ are N.

Preferably, $Ar_4$ and $Ar_5$ are the same as or different from each other, and each independently represent phenyl, phenyl substituted with methyl, or naphthyl.

Preferably, L is phenylene.

Preferably, $Ar_6$ is phenylene, naphthylene, phenanthrenylene, dimethylfluorenylene, dibenzofuranylene, or dibenzothiophenylene.

Preferably, the compound represented by Chemical Formula 2 is any one selected from the group consisting of:

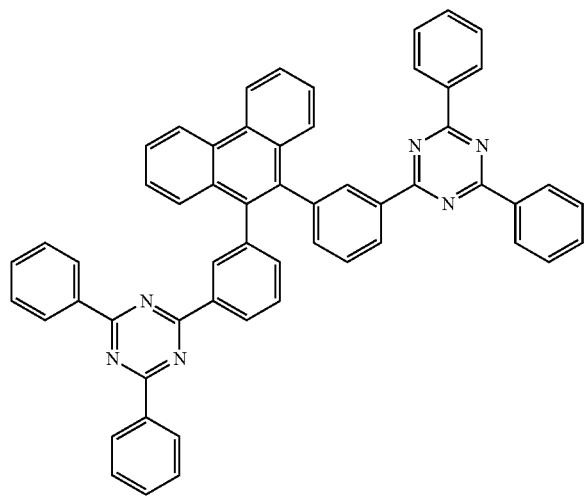

2-1

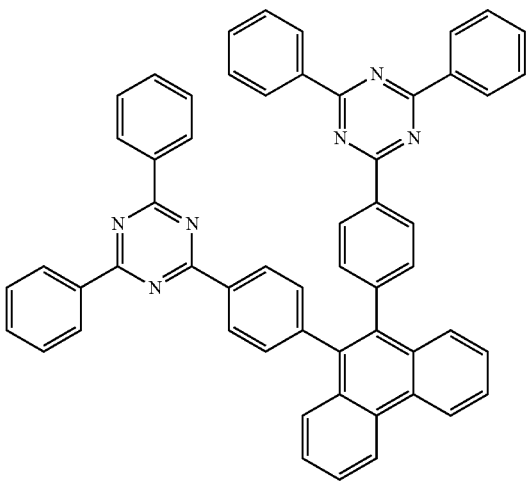

2-2

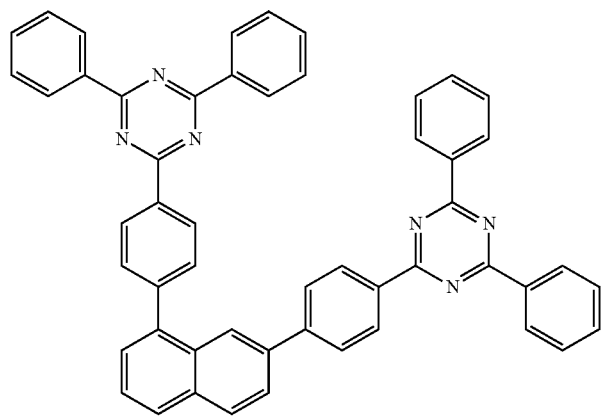

2-3

-continued
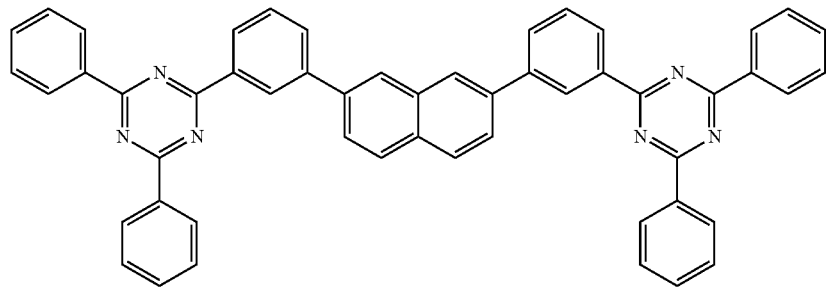
2-4
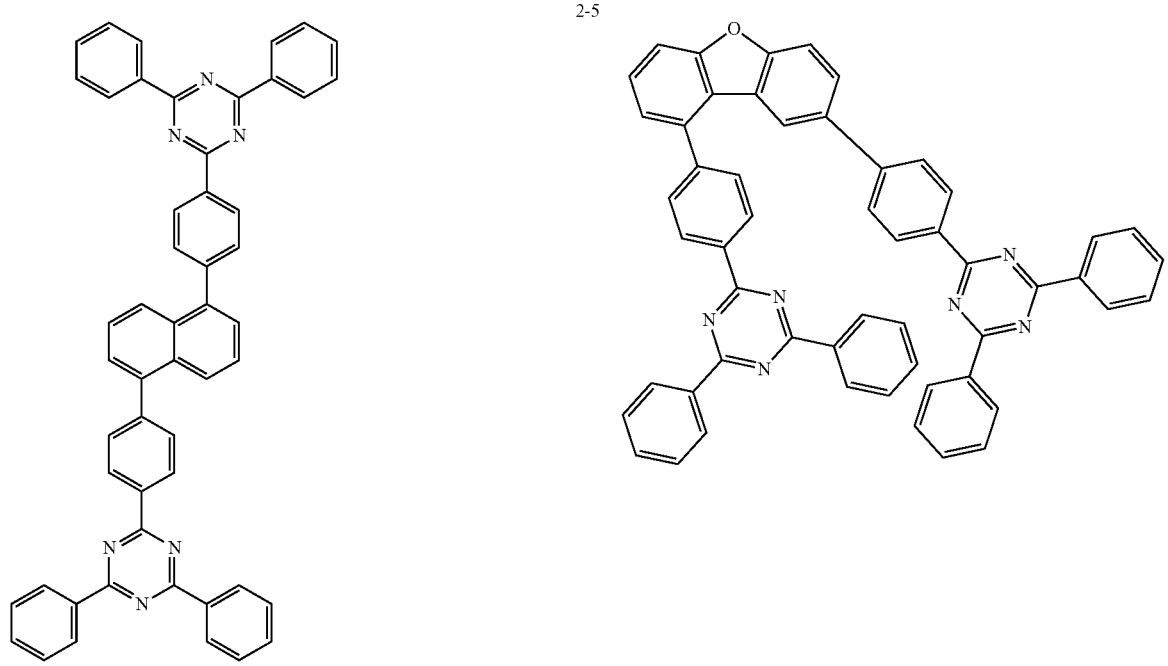
2-5
2-6
2-7
2-8
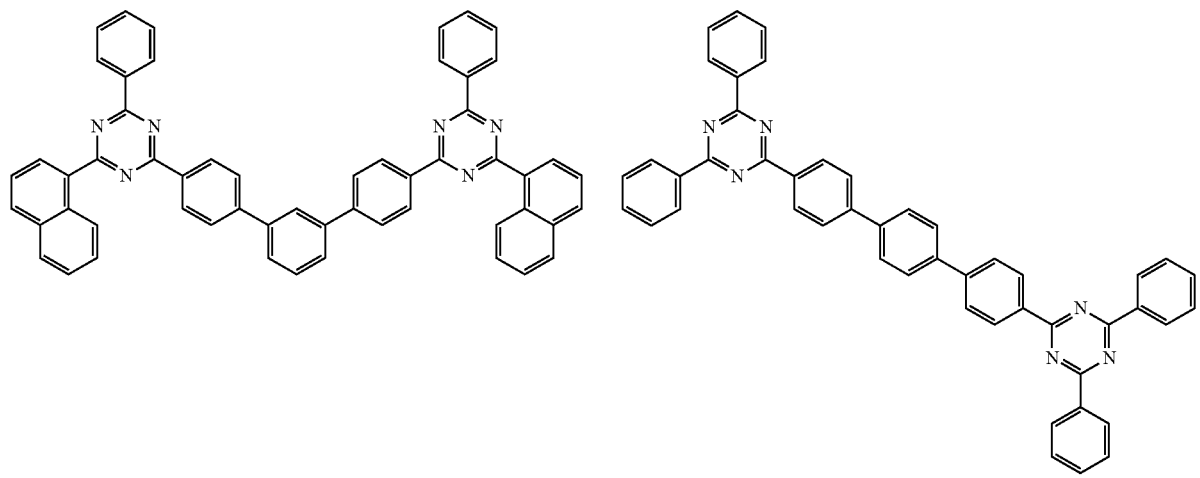

-continued
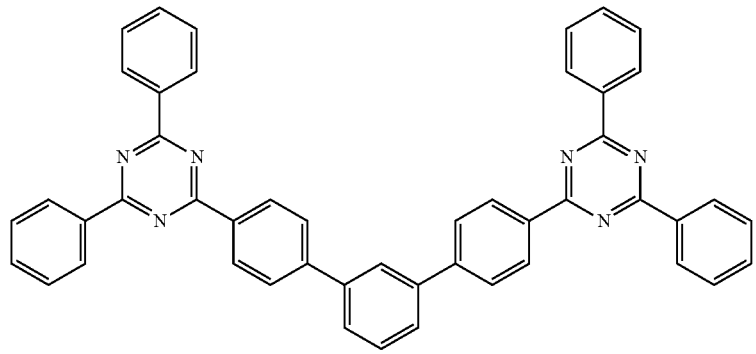
2-9
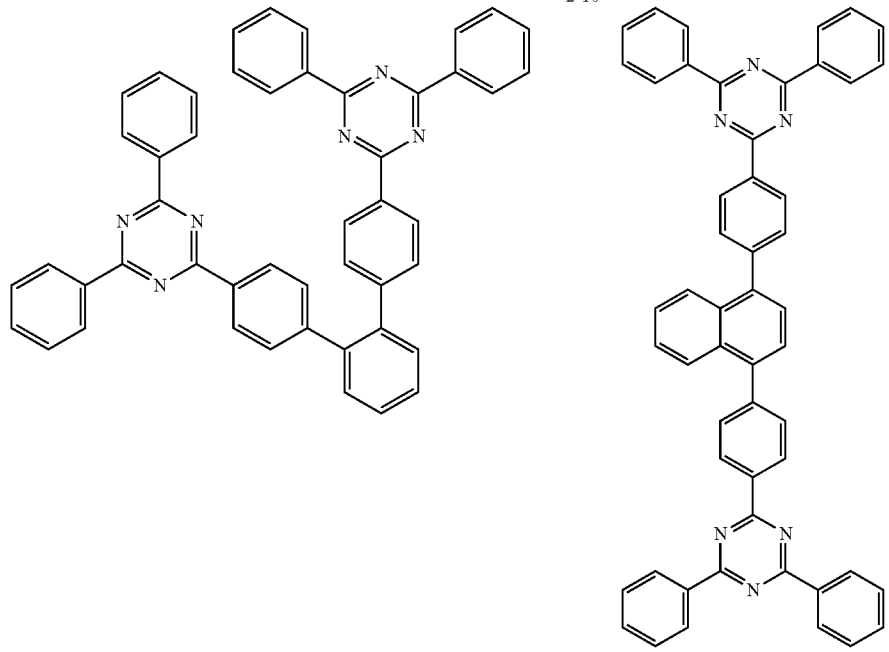
2-10
2-11
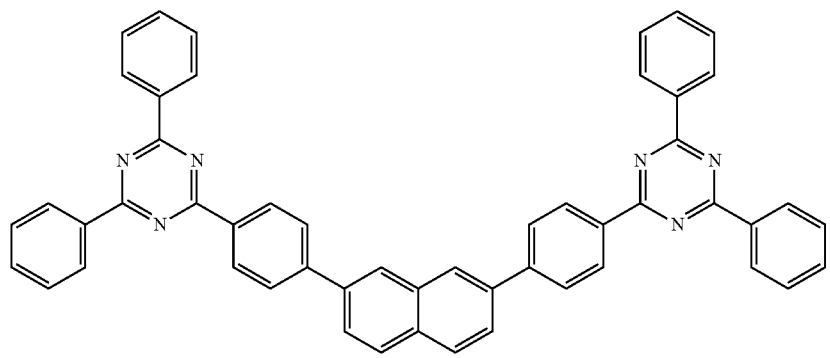
2-12

-continued
2-13
2-14
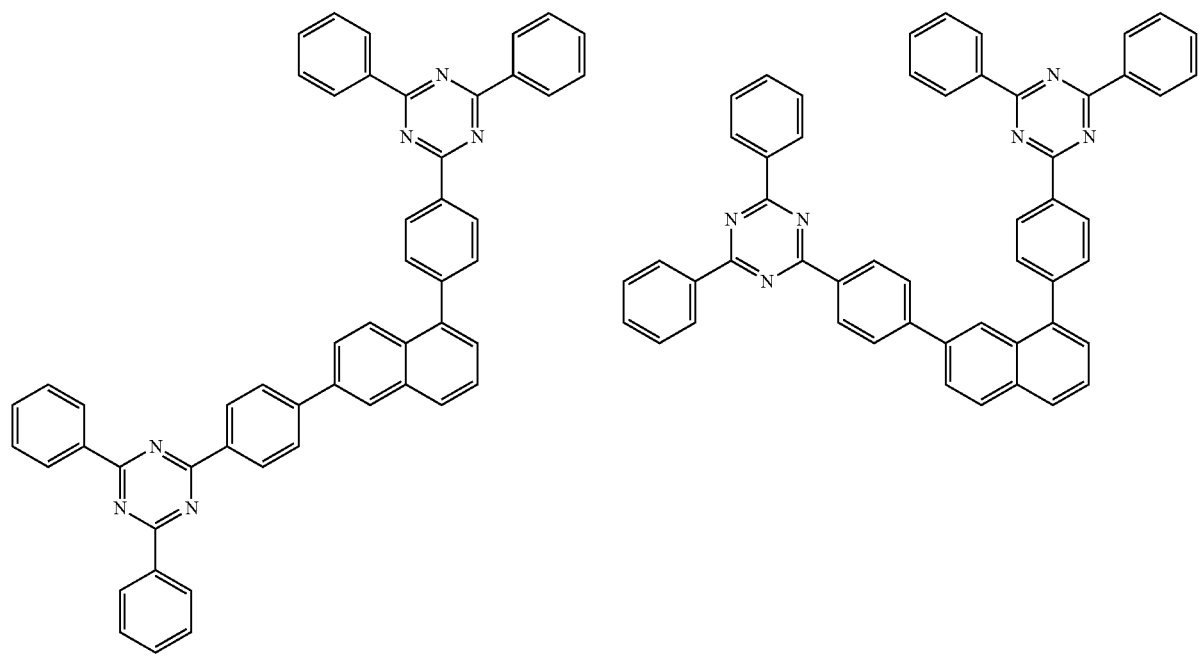
2-15
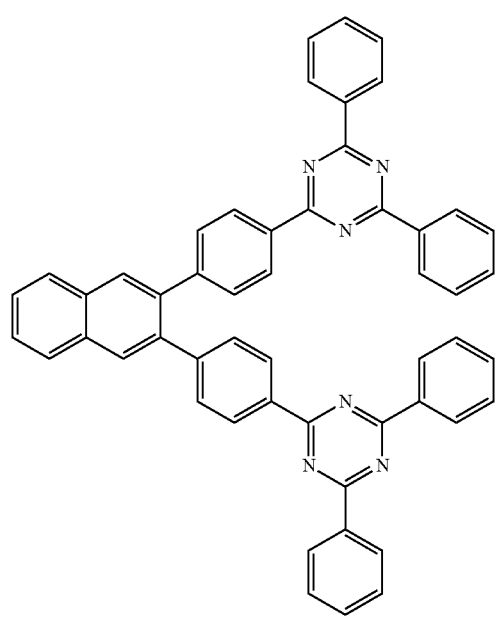

2-16
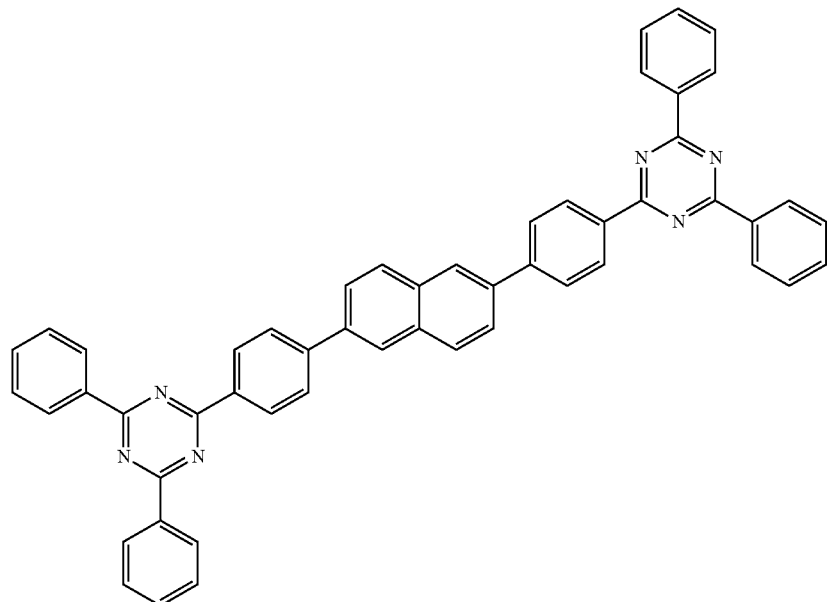
2-17
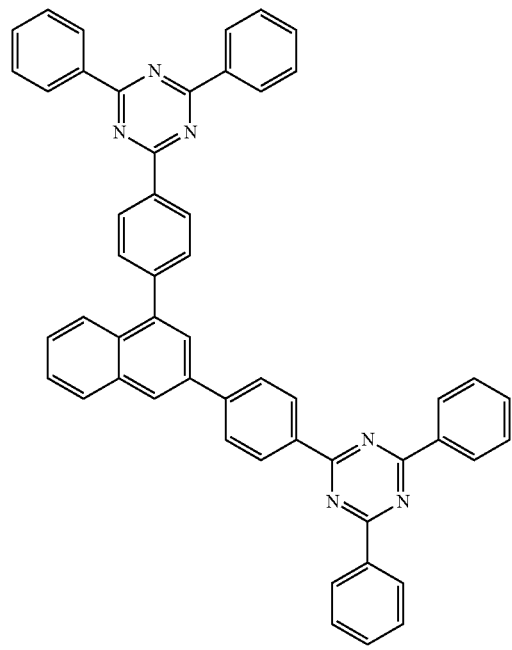
2-18
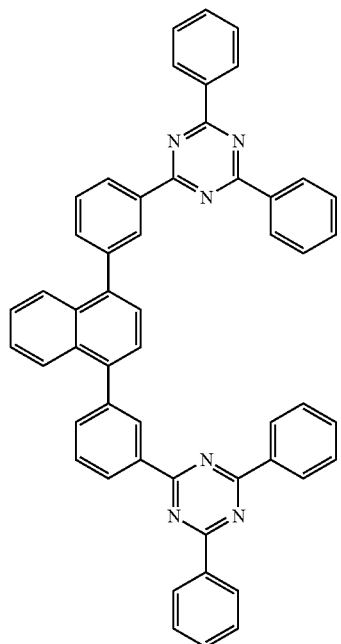

-continued
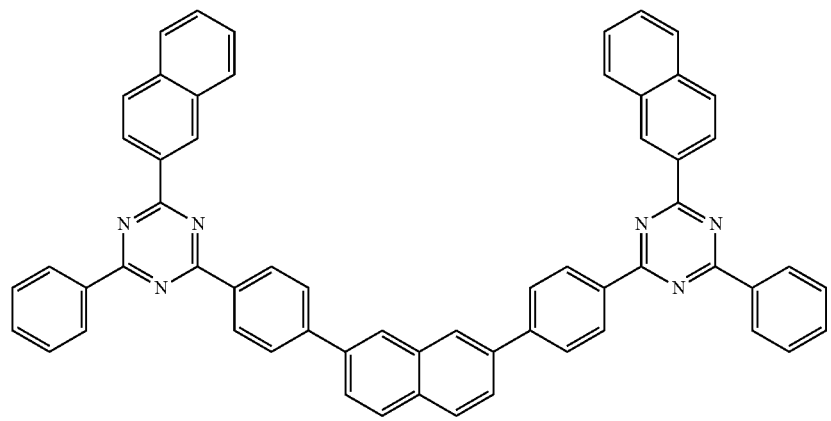
2-19
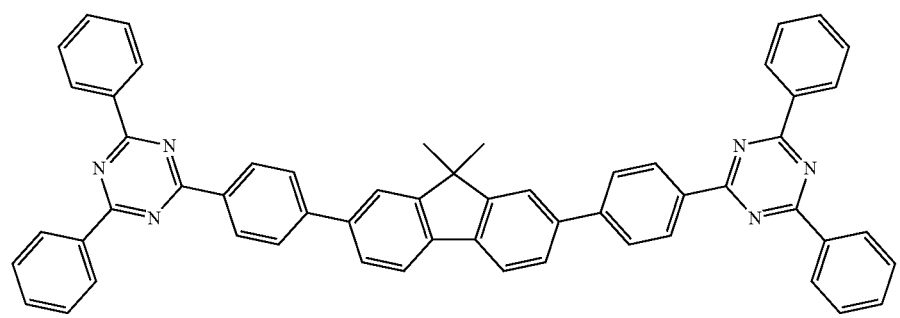
2-20
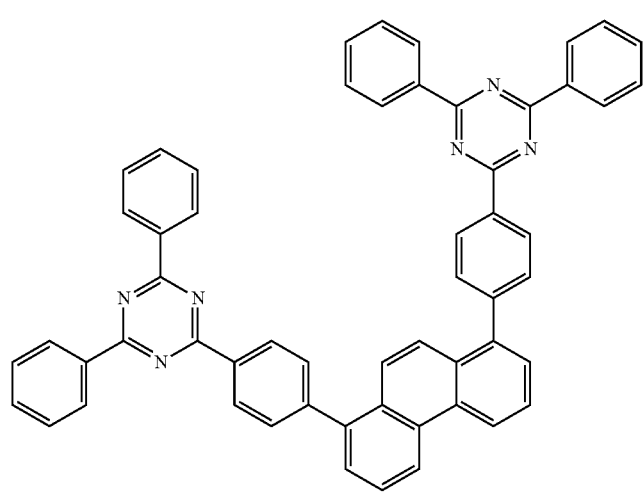
2-21
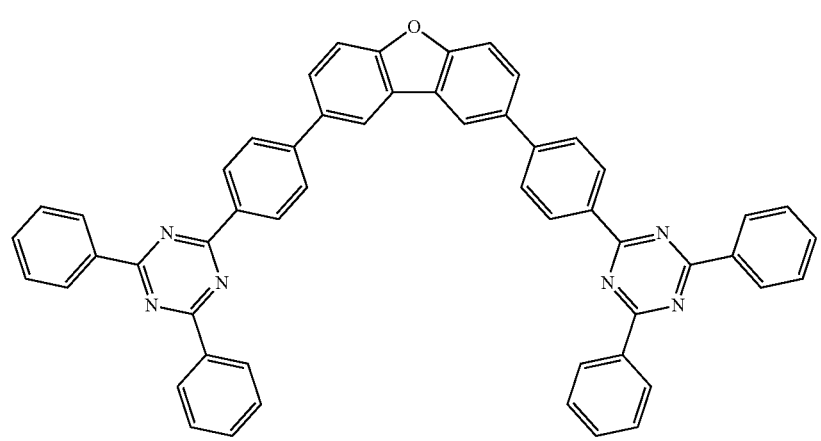
2-22

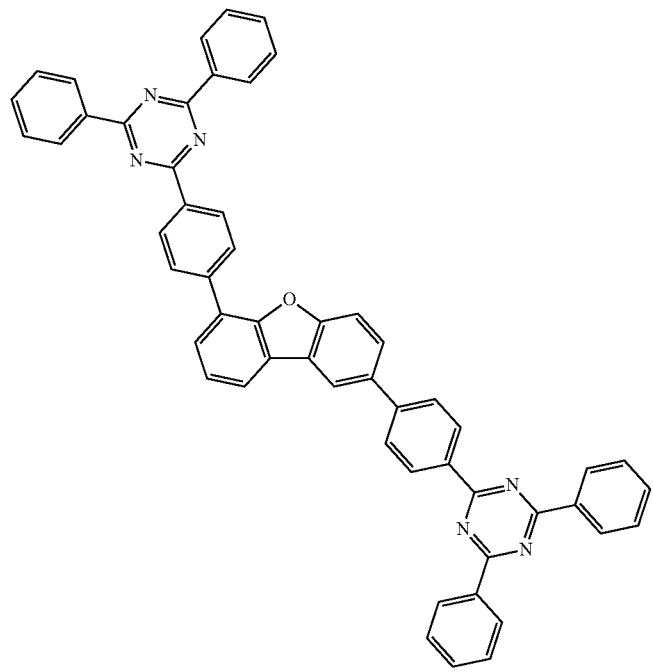
2-23
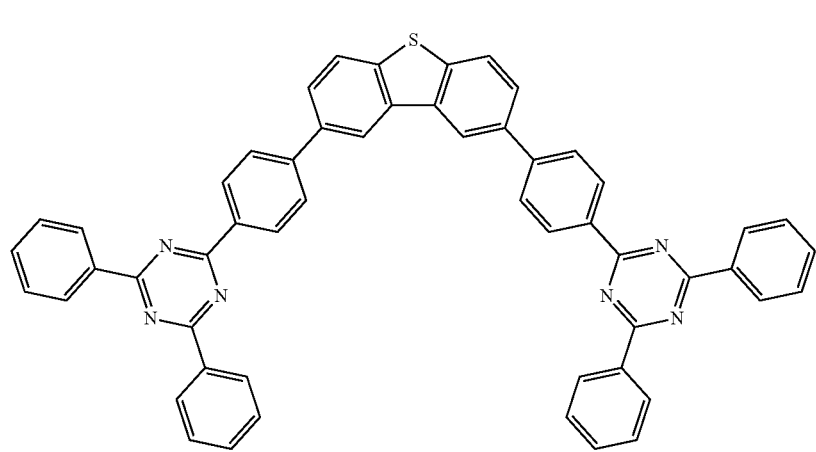
2-24

-continued 2-25

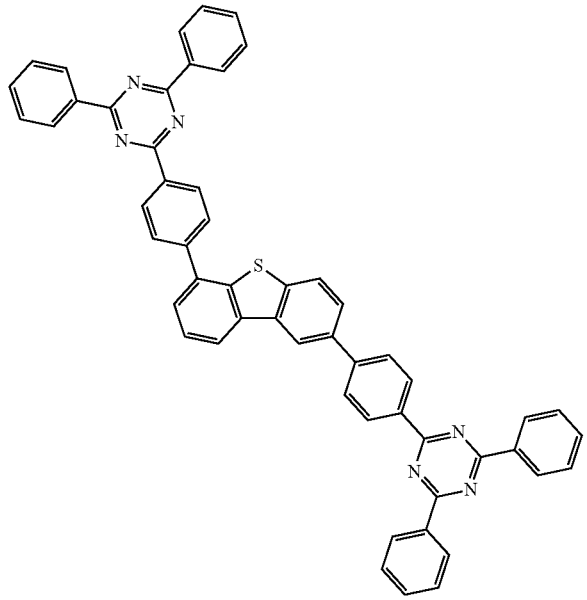

2-26

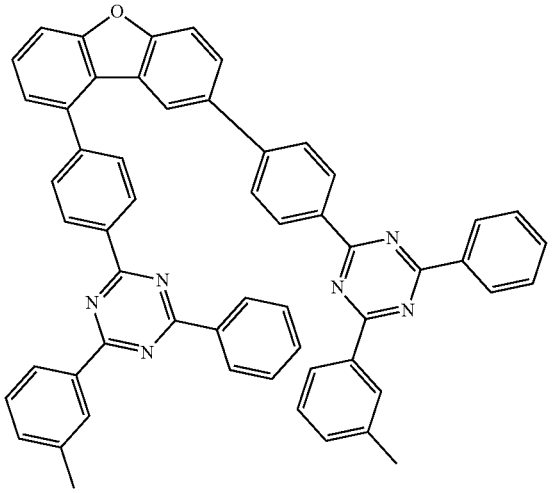

The compound represented by Chemical Formula 2 can be prepared, by a preparation method as shown in the following Reaction Scheme 2.

[Reaction Scheme 2]

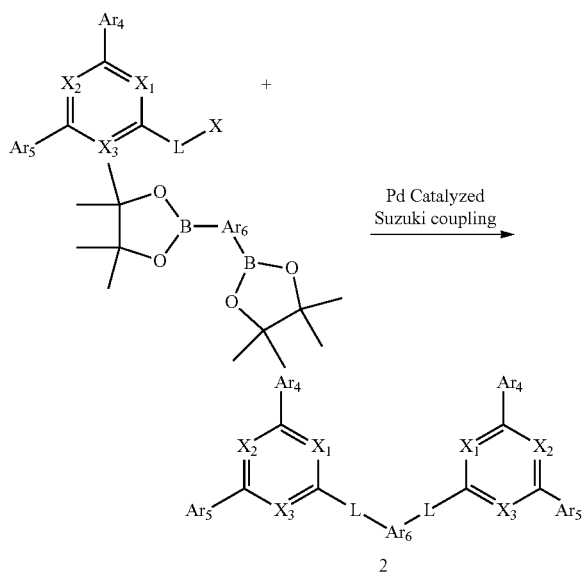

in Reaction Scheme 2, $X_1$ to $X_3$, $Ar_4$, $Ar_5$, L, and $Ar_6$ are as defined above, and X is halogen (I, Br, or Cl). The reaction is a step of coupling a compound substituted with halogen and an aromatic compound substituted with boronic acid derivative using a palladium catalyzed reaction to prepare a compound represented by Chemical Formula 2. The preparation method can be further specified in Preparation Examples to be described later.

Electron Injection Layer

The organic light emitting device according to the present invention may further include an electron injection layer between the electron transport layer and the cathode. The electron injection layer is a layer injecting electrons from the electrode, and a compound which has an ability of transporting the electrons, an electron injection effect from the cathode, and an excellent electron injection effect to the light emitting layer or the light emitting material, prevents movement of an exciton generated in the light emitting layer to the hole injection layer, and has an excellent thin film forming ability is preferable.

Specific examples materials that can be used for the electron injection layer include fluorenone, anthraquinodimethane, diphenoquinone, thiopyran dioxide, oxazole, oxadiazole, triazole, imidazole, perylene tetracarboxylic acid, fluorenylidene methane, anthrone, and the like, and its derivative, a metal complex compound, a nitrogen-containing 5-membered cycle derivative, and the like, but are not limited thereto.

Examples of the metal complex compound include 8-hydroxyquinolinato lithium, bis(8-hydroxyquinolinato)zinc, bis(8-hydroxyquinolinato)copper, bis(8-hydroxyquinolinato)manganese, tris(8-hydroxyquinolinato)aluminum, tris(2-methyl-8-hydroxyquinolinato)aluminum, tris(8-hydroxyquinolinato)gallium, bis(10-hydroxybenzo[h]quinolinato)beryllium, bis(10-hydroxybenzo[h]quinolinato)zinc, bis(2-methyl-8-quinolinato)chlorogallium, bis(2-methyl-8-quinolinato)(o-cresolato)gallium, bis(2-methyl-8-quinolinato)(1-naphtholato)aluminum, bis(2-methyl-8-quinolinato)(2-naphtholato)gallium, and the like, but are not limited thereto.

Organic Light Emitting Device

Figures 1, 2:
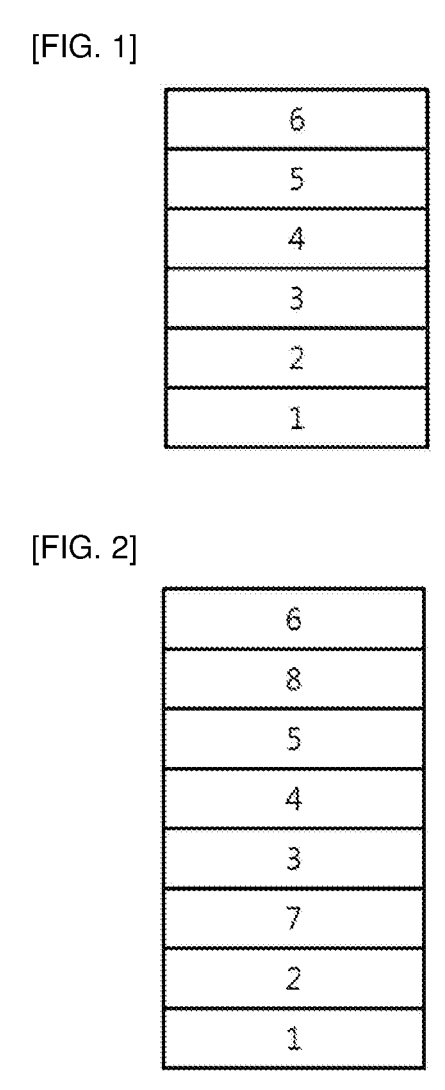

The structure of the organic light emitting device according to the present invention is illustrated in FIG. 1. FIG. 1 shows an example of an organic light emitting device comprising a substrate 1, an anode 2, a hole transport layer 3, a light emitting layer 4, an electron transport layer 5, and a cathode 6.

Further, another structure of the organic light emitting device according to the present invention is illustrated in FIG. 2. FIG. 2 shows an example of an organic light emitting device comprising a substrate 1, an anode 2, a hole injection layer 7, a hole transport layer 3, a light emitting layer 4, an electron transport layer 5, an electron injection layer 8 and a cathode 6.

The organic light emitting device according to the present invention may be manufactured by sequentially laminating the above-described structures. In this case, the organic light emitting device may be manufactured by depositing a metal, metal oxides having conductivity, or an alloy thereof on the substrate by using a PVD (physical vapor deposition) method such as a sputtering method or an e-beam evaporation method to form the anode, forming the organic material layer including the hole injection layer, the hole transport layer, the light emitting layer, and the electron transport layer thereon, and then depositing a material that can be used as the cathode thereon. In addition to such a method, the organic light emitting device may be manufactured by sequentially depositing a cathode material, an organic material layer and an anode material on a substrate. In addition, the light emitting layer may be formed by subjecting a host and a dopant to a vacuum evaporation as well as a solution coating. Herein, the solution coating method means spin coating, dip coating, doctor blading, inkjet printing, screen printing, spray method, roll coating, or the like, but is not limited thereto.

In addition to such a method, the organic light emitting device may be manufactured by sequentially depositing a cathode material, an organic material layer, and an anode material on a substrate (International Publication WO 2003/012890). However, the manufacturing method is not limited thereto.

Meanwhile, the organic light emitting device according to the present invention may be a front side emission type, a back side emission type, or a double side emission type according to the used material.

Hereinafter, preferred examples of the present invention will be described in order to facilitate understanding of the present invention. However, the following examples are presented for illustrative purposes only, and the scope of the present invention is not limited thereto.

Preparation Example 1

Preparation Example 1-1

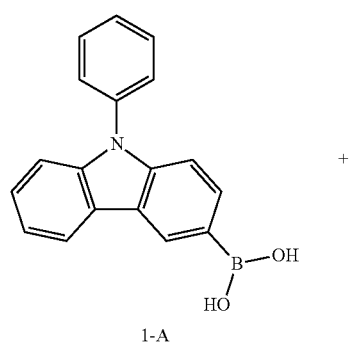

1-A

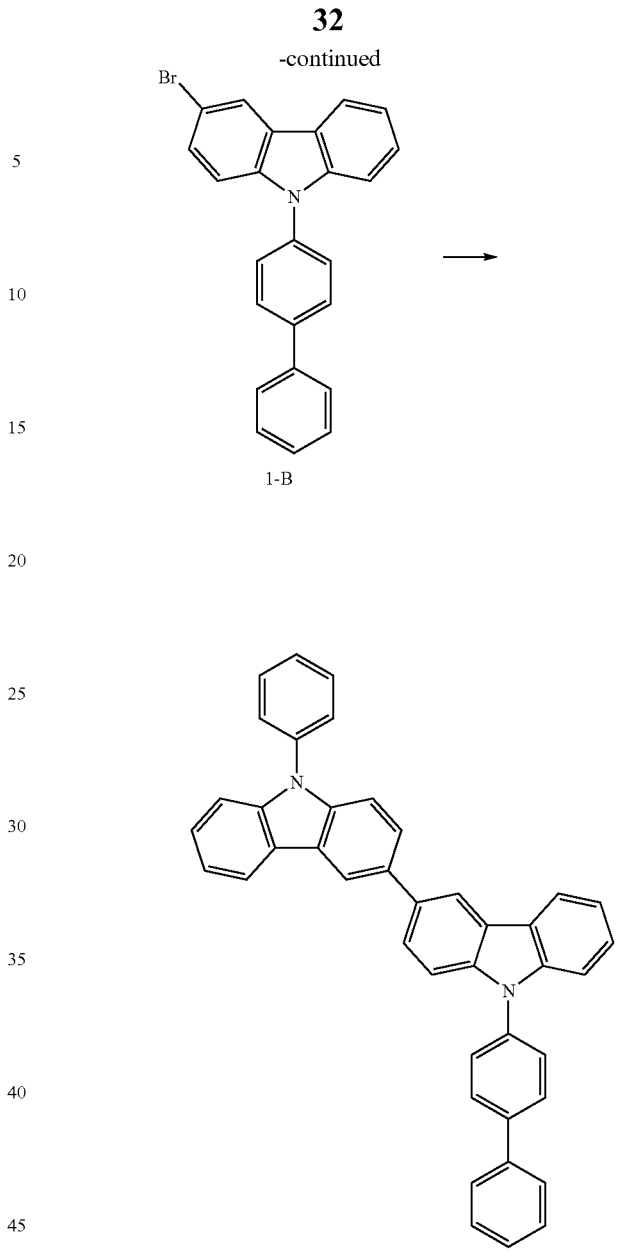

The compound (20 g, 69.7 mmol) represented by Chemical Formula 1-A and the compound (27.8 g, 69.7 mmol) represented by Chemical Formula 1-B were added to 300 mL of THF under nitrogen atmosphere, 150 mL of 2M potassium carbonate aqueous solution was added while stirring, and tetrakis triphenylphosphine palladium (1.6 g, 1.4 mmol) was added thereto, and then the mixture was heated and stirred for 6 hours. After lowering the temperature to room temperature, the reaction was terminated, the potassium carbonate aqueous solution was removed, and a white solid formed during the reaction was filtered. The filtered solid was recrystallized from THF to prepare the compound (30.1 g, yield 77%) represented by Chemical Formula 1-1.

MS: $[M+H]^+ = 561$

Preparation Example 1.2

Preparation Example 1-3

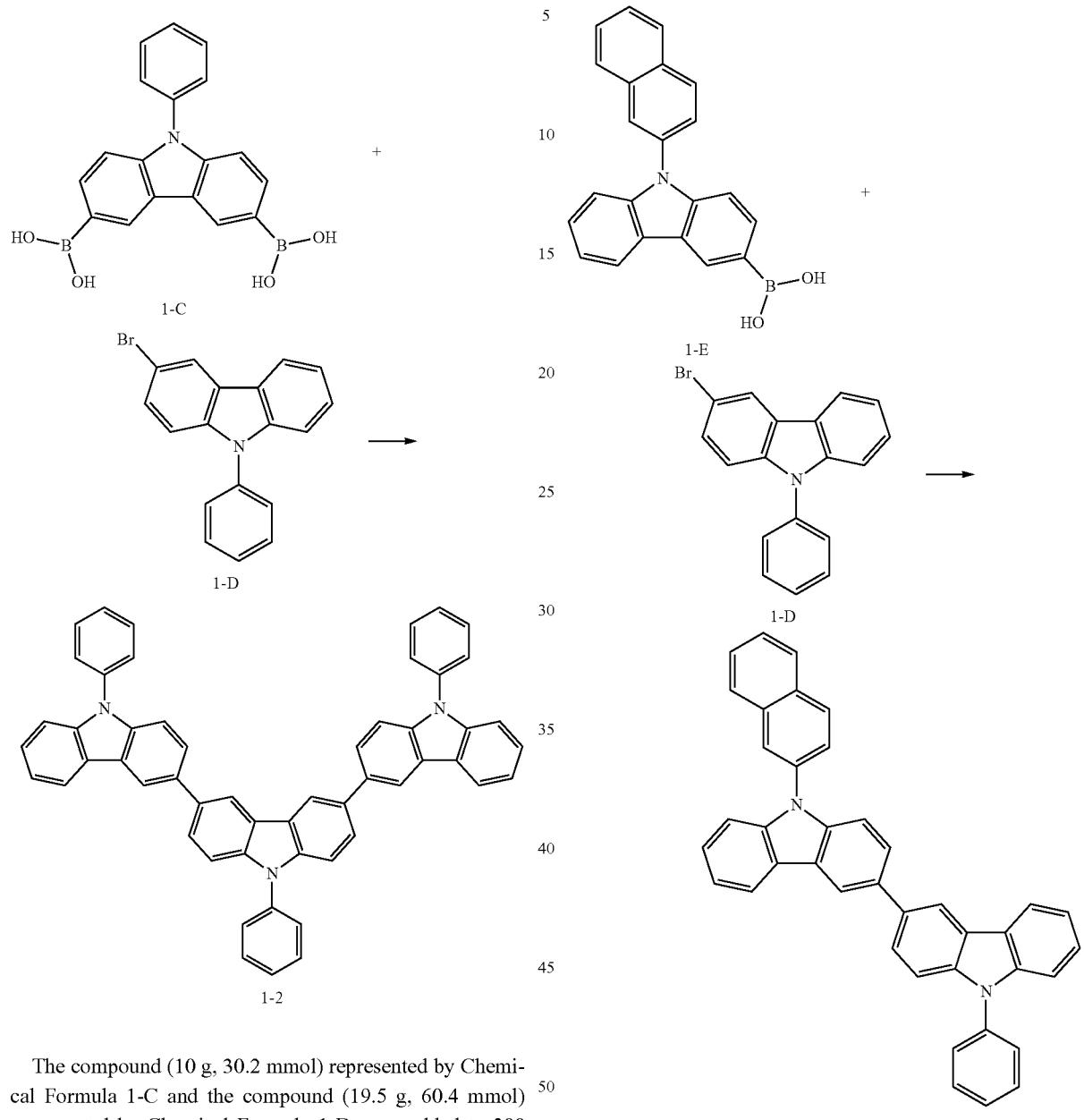

The compound (10 g, 30.2 mmol) represented by Chemical Formula 1-C and the compound (19.5 g, 60.4 mmol) represented by Chemical Formula 1-D were added to 200 mL of THF under nitrogen atmosphere, 100 mL of 2M potassium carbonate aqueous solution was added while stirring, and tetrakis triphenylphosphine palladium (0.7 g, 0.6 mmol) was added thereto, and then the mixture was heated and stirred for 7 hours. After lowering the temperature to room temperature, the reaction was terminated, the potassium carbonate aqueous solution was removed, and a white solid formed during the reaction was filtered. The filtered solid was recrystallized from THF to prepare the compound (14.5 g, yield 66%) represented by Chemical Formula 1-2.

MS: [M+H]$^+$=726

The compound (15 g, 44.5 mmol) represented by Chemical Formula 1-E and the compound (14.3 g, 44.5 mmol) represented by Chemical Formula 1-D were added to 200 mL of THF under nitrogen atmosphere, 100 mL of 2M potassium carbonate aqueous solution was added while stirring, and tetrakis triphenylphosphine palladium (1.03 g, 0.9 mmol) was added thereto, and then the mixture was heated and stirred for 10 hours. After lowering the temperature to room temperature, the reaction was terminated, the potassium carbonate aqueous solution was removed, and a white solid formed during the reaction was filtered. The filtered solid was recrystallized from THF to prepare the compound (17.9 g, yield 75%) represented by Chemical Formula 1-3.

MS: [M+H]$^+$=535

Preparation Example 1-4

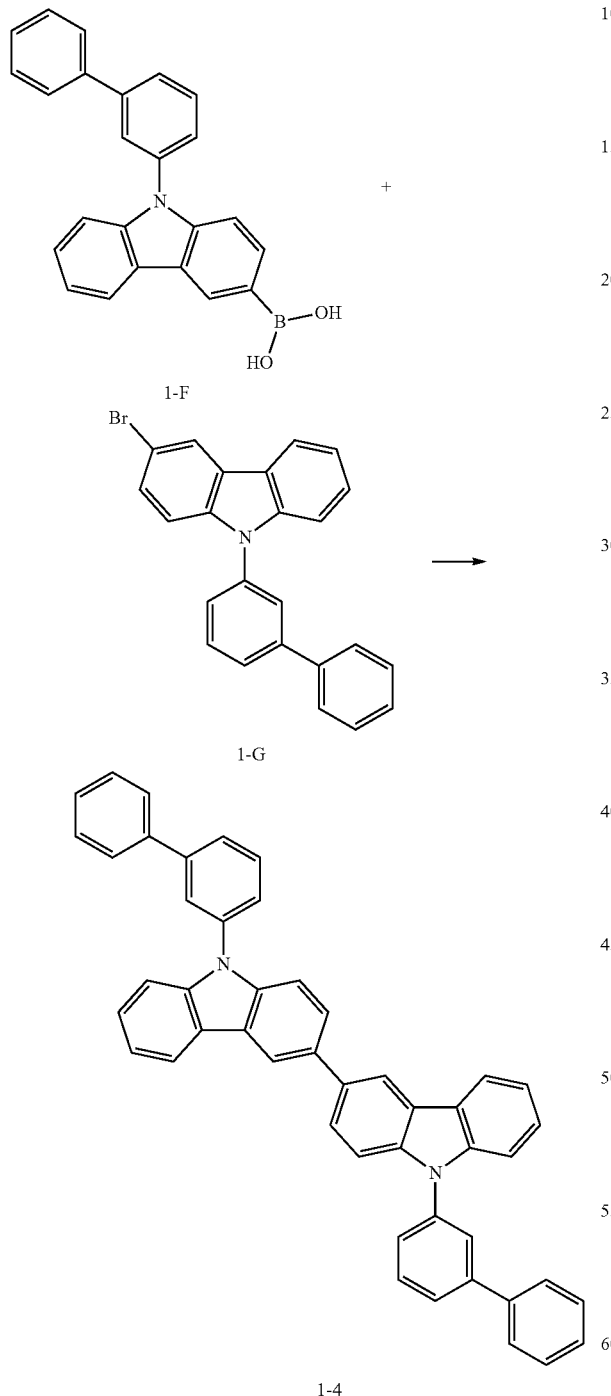

1-F

1-G 1-4

The compound (15 g, 41.3 mmol) represented by Chemical Formula 1-F and the compound (16.4 g, 41.3 mmol) represented by Chemical Formula 1-G were added to 200 mL of THF under nitrogen atmosphere, 100 mL of 2M potassium carbonate aqueous solution was added while stirring, and tetrakis triphenylphosphine palladium (0.95 g, 0.8 mmol) was added thereto, and then the mixture was heated and stirred for 8 hours. After lowering the temperature to room temperature, the reaction was terminated, the potassium carbonate aqueous solution was removed, and a white solid formed during the reaction was filtered. The filtered solid was recrystallized from THF to prepare the compound (17.9 g, yield 68%) represented by Chemical Formula 1-4.

MS: [M+H]$^+$=637

Preparation Example 2

Preparation Example 2.1

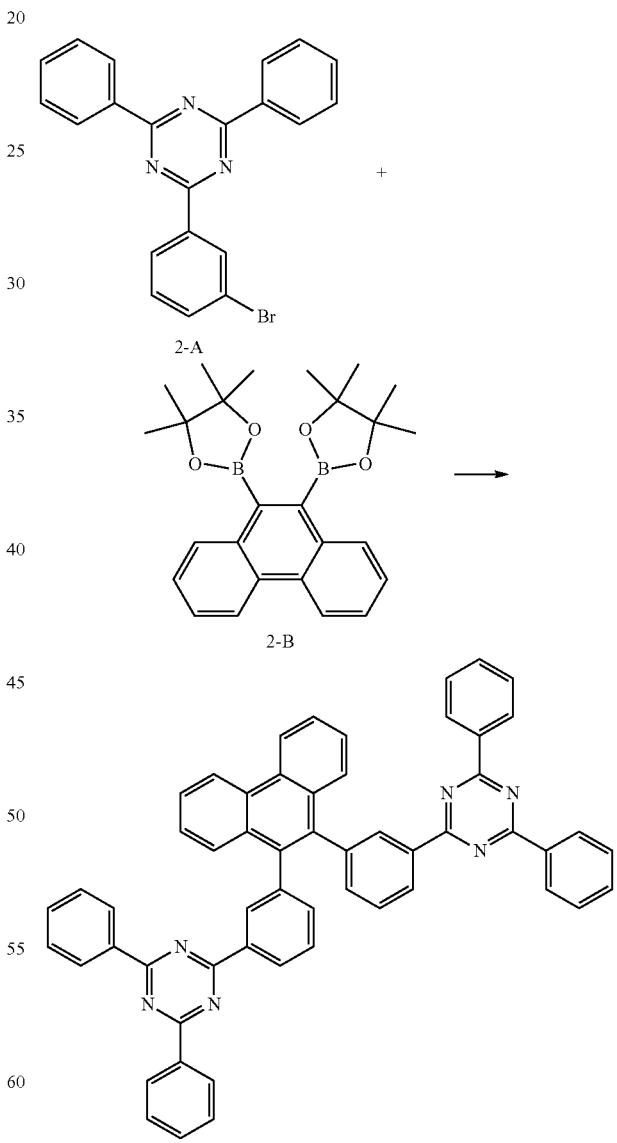

2-A

2-B 2-1

The compound (20 g, 51.5 mmol) represented by Chemical Formula 2-A and the compound (11.1 g, 25.8 mmol)

represented by Chemical Formula 2-B were added to 200 mL of THF under nitrogen atmosphere, 100 mL of 2M potassium carbonate aqueous solution was added while stirring, and tetrakis triphenylphosphine palladium (1.2 g, 1.0 mmol) was added thereto, and then the mixture was heated and stirred for 6 hours. After lowering the temperature to room temperature, the reaction was terminated, the potassium carbonate aqueous solution was removed, and a white solid formed during the reaction was filtered. The filtered solid was recrystallized from THF to prepare the compound (15.5 g, yield 76%) represented by Chemical Formula 2-1.

MS: [M+H]$^+$=793

Preparation Example 2-2

The compound (20 g, 51.5 mmol) represented by Chemical Formula 2-C and the compound (11.1 g, 25.8 mmol) represented by Chemical Formula 2-B were added to 200 mL of THF under nitrogen atmosphere, 100 mL of 2M potassium carbonate aqueous solution was added while stirring, and tetrakis triphenylphosphine palladium (1.2 g, 1.0 mmol) was added thereto, and then the mixture was heated and stirred for 8 hours. After lowering the temperature to room temperature, the reaction was terminated, the potassium carbonate aqueous solution was removed, and a white solid formed during the reaction was filtered. The filtered solid was recrystallized from THF to prepare the compound (17.1 g, yield 84%) represented by Chemical Formula 2-2.

MS: [M+H]$^+$=793

Preparation Example 2-3

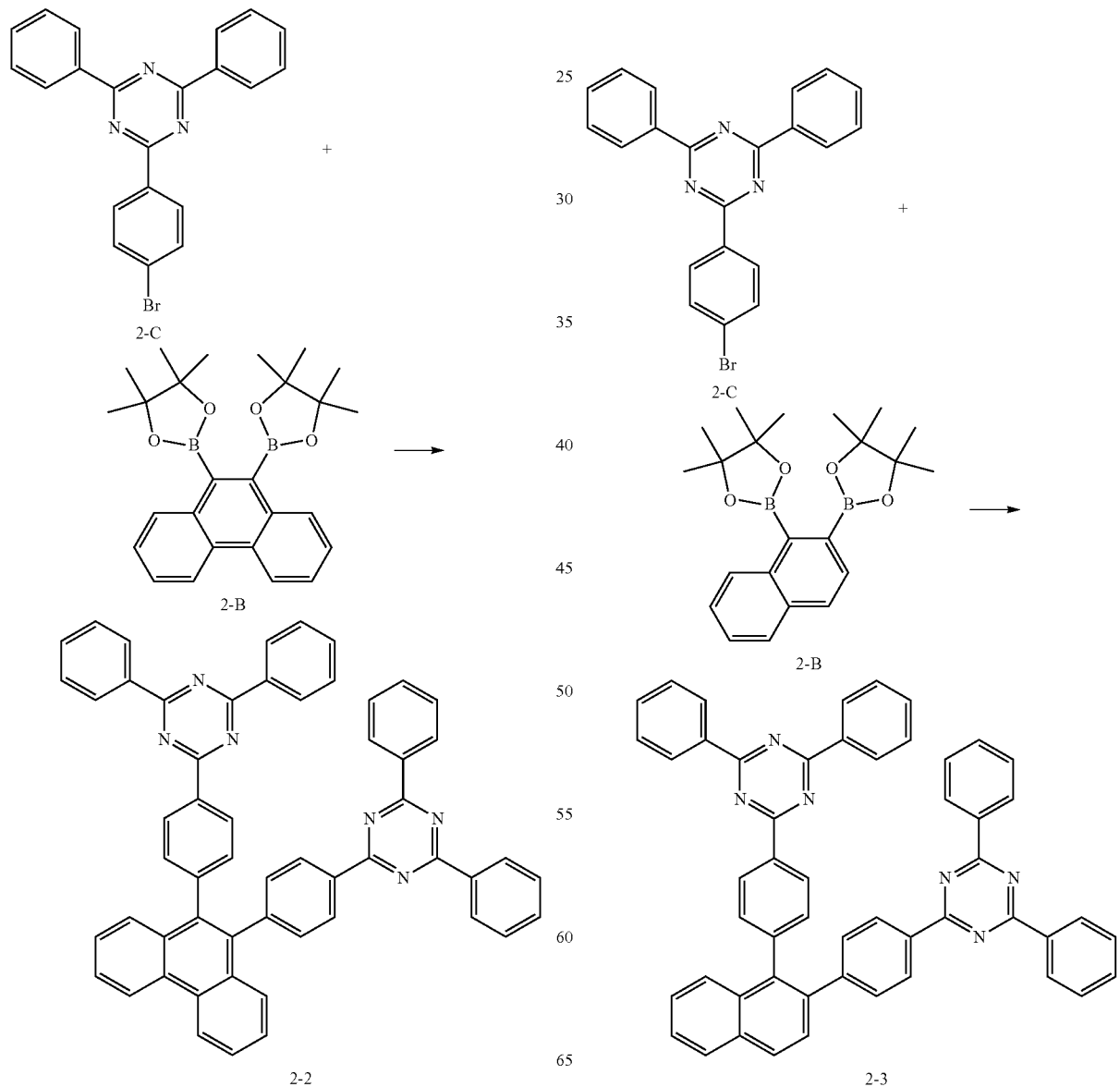

The compound (20 g, 51.5 mmol) represented by Chemical Formula 2-C and the compound (9.8 g, 25.8 mmol) represented by Chemical Formula 2-D were added to 200 mL of THF under nitrogen atmosphere, 100 mL of 2M potassium carbonate aqueous solution was added while stirring, and tetrakis triphenylphosphine palladium (1.2 g, 1.0 mmol) was added thereto, and then the mixture was heated and stirred for 10 hours. After lowering the temperature to room temperature, the reaction was terminated, the potassium carbonate aqueous solution was removed, and a white solid formed during the reaction was filtered. The filtered solid was recrystallized from THF to prepare the compound (17.1 g, yield 84%) represented by Chemical Formula 2-3.

MS: [M+H]$^+$=743

Preparation Example 2-4

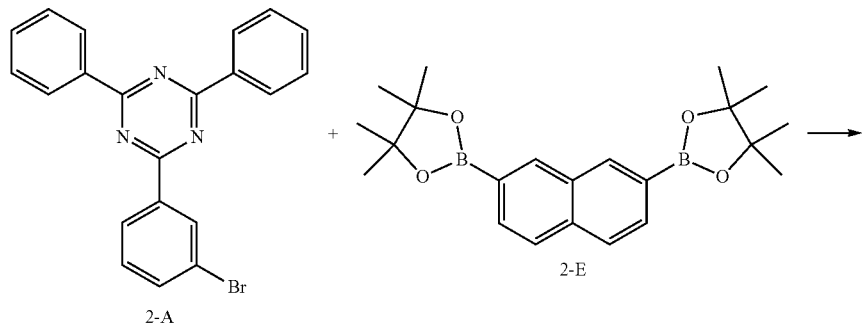

Preparation Example 2-5

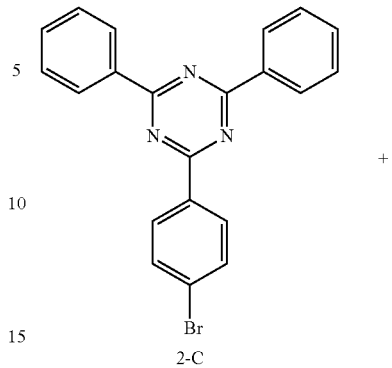

The compound (20 g, 51.5 mmol) represented by Chemical Formula 2-A and the compound (9.8 g, 25.8 mmol) represented by Chemical Formula 2-E were added to 200 mL of THF under nitrogen atmosphere, 100 mL of 2M potassium carbonate aqueous solution was added while stirring, and tetrakis triphenylphosphine palladium (1.2 g, 1.0 mmol) was added thereto, and then the mixture was heated and stirred for 7 hours. After lowering the temperature to room temperature, the reaction was terminated, the potassium carbonate aqueous solution was removed, and a white solid formed during the reaction was filtered. The filtered solid was recrystallized from THF to prepare the compound (13.2 g, yield 69%) represented by Chemical Formula 2-4.

MS: [M+H]$^+$=743

-continued

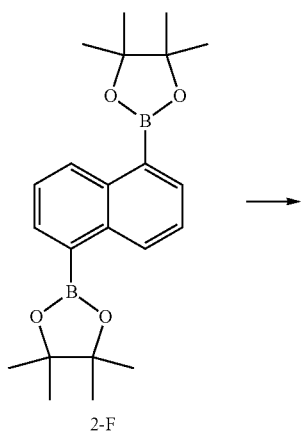

-continued

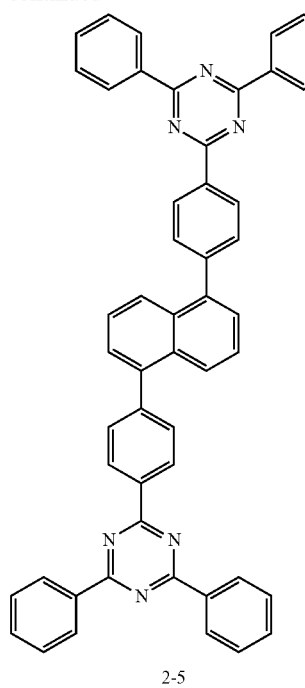

2-5

The compound (20 g, 51.5 mmol) represented by Chemical Formula 2-C and the compound (9.8 g, 25.8 mmol) represented by Chemical Formula 2-F were added to 200 mL of THF under nitrogen atmosphere, 100 mL of 2M potassium carbonate aqueous solution was added while stirring, and tetrakis triphenylphosphine palladium (1.2 g, 1.0 mmol) was added thereto, and then the mixture was heated and stirred for 9 hours. After lowering the temperature to room temperature, the reaction was terminated, the potassium carbonate aqueous solution was removed, and a white solid formed during the reaction was filtered. The filtered solid was recrystallized from THF to prepare the compound (14.7 g, yield 77%) represented by Chemical Formula 2-5.

MS: [M+H]⁺=743

Preparation Example 2-6

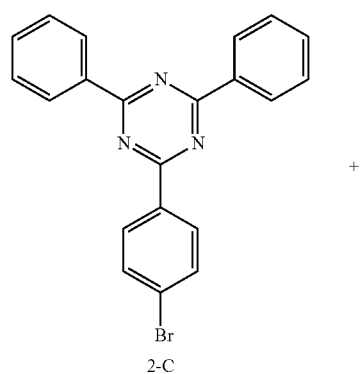

2-C

-continued

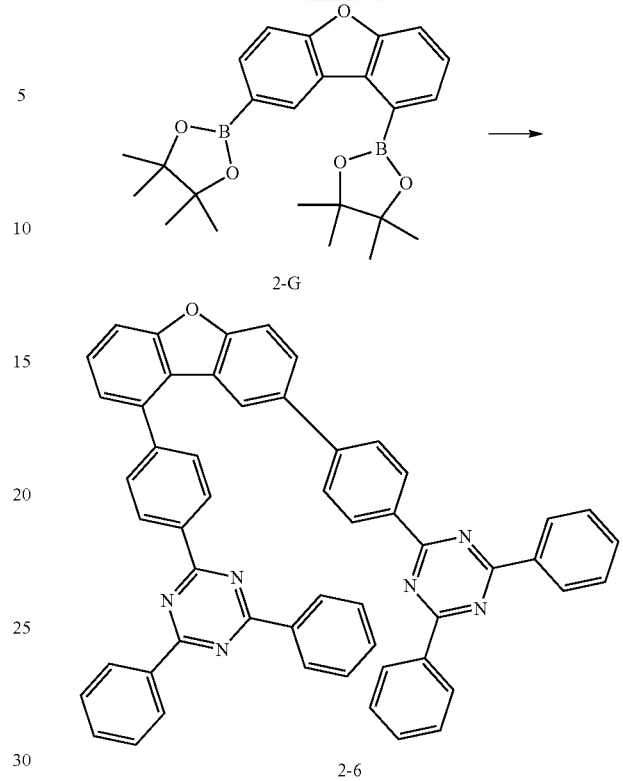

2-6

The compound (20 g, 51.5 mmol) represented by Chemical Formula 2-C and the compound (10.8 g, 25.8 mmol) represented by Chemical Formula 2-G were added to 200 mL of THF under nitrogen atmosphere, 100 mL of 2M potassium carbonate aqueous solution was added while stirring, and tetrakis triphenylphosphine palladium (1.2 g, 1.0 mmol) was added thereto, and then the mixture was heated and stirred for 12 hours. After lowering the temperature to room temperature, the reaction was terminated, the potassium carbonate aqueous solution was removed, and a white solid formed during the reaction was filtered. The filtered solid was recrystallized from THF to prepare the compound (13.3 g, yield 66%) represented by Chemical Formula 2-6.

MS: [M+H]⁺=783

Preparation Example 2-7

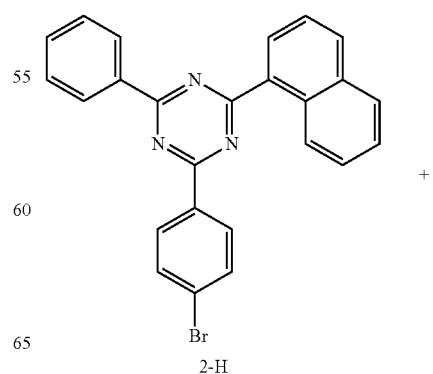

2-H

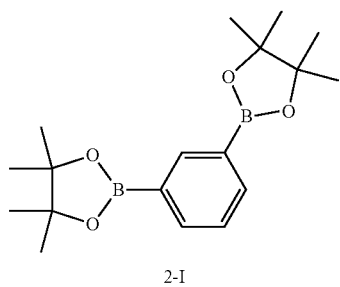

2-I

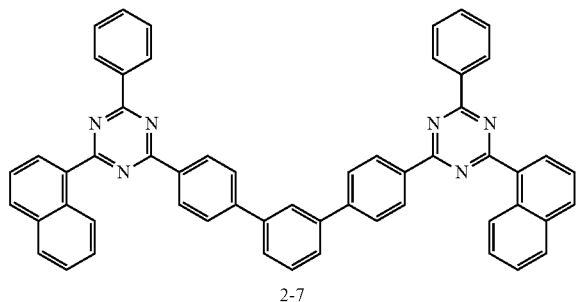

2-7

The compound (20 g, 45.8 mmol) represented by Chemical Formula 2-H and the compound (7.6 g, 22.9 mmol) represented by Chemical Formula 2-I were added to 200 mL of THF under nitrogen atmosphere, 100 mL of 2M potassium carbonate aqueous solution was added while stirring, and tetrakis triphenylphosphine palladium (1.2 g, 1.0 mmol) was added thereto, and then the mixture was heated and stirred for 8 hours. After lowering the temperature to room temperature, the reaction was terminated, the potassium carbonate aqueous solution was removed, and a white solid formed during the reaction was filtered. The filtered solid was recrystallized from THF to prepare the compound (13.6 g, yield 75%) represented by Chemical Formula 2-7.

MS: $[M+H]^+=793$

In addition to the above compounds, the compounds used in the following Examples and Comparative Examples were as follows.

HI-1

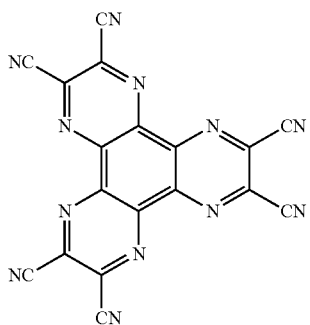

HTL

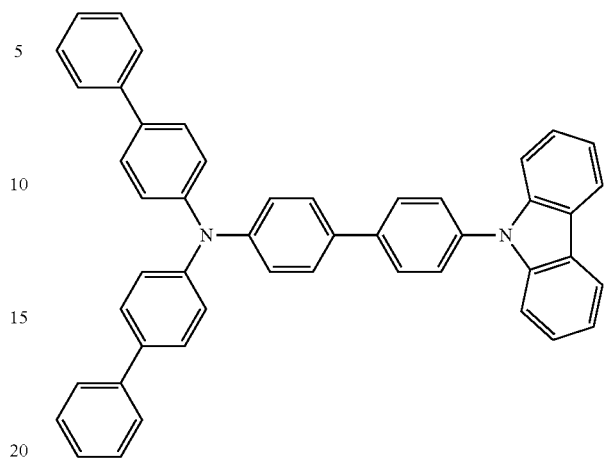

Host 1

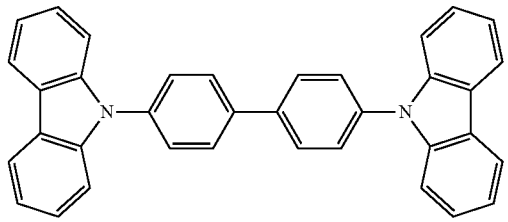

Host 2

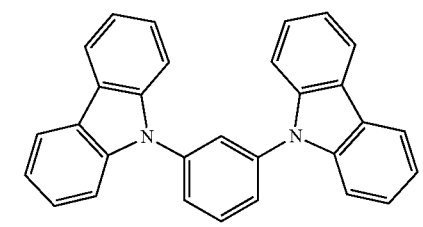

Host 3

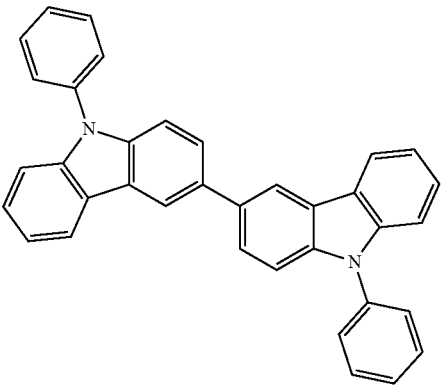

GD (Green Dopant)

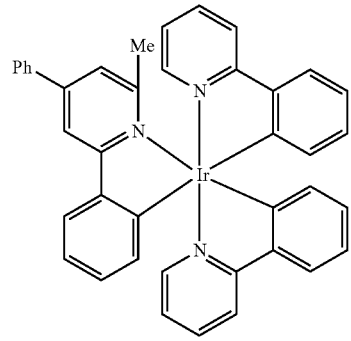

ETL1

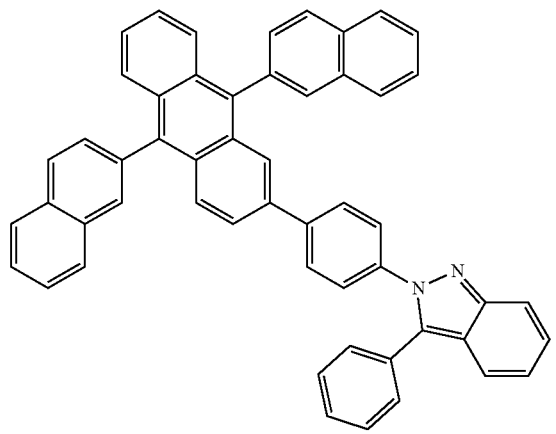

ETL2

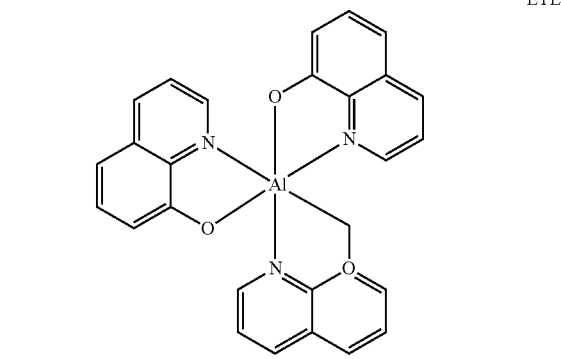

ETL-3

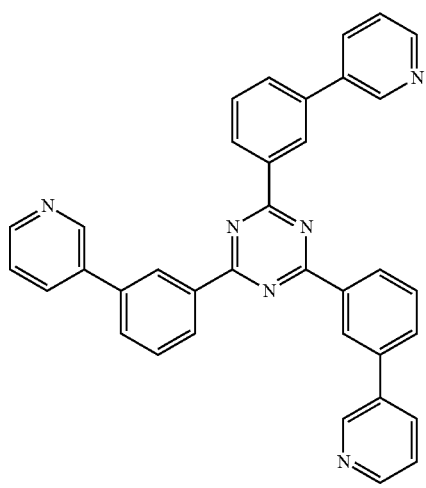

Example and Comparative Example

A glass substrate on which a thin film of ITO (indium tin oxide) was coated in a thickness of 150 mm was added to distilled water containing the detergent dissolved therein and washed by the ultrasonic wave. The used detergent was a product commercially available from Fisher Co. and the distilled water was one which had been twice filtered by using a filter commercially available from Millipore Co. The ITO was washed for 30 minutes, and ultrasonic washing was then repeated twice for 10 minutes by using distilled water. After the washing with distilled water was completed, the substrate was ultrasonically washed with isopropyl alcohol, acetone, and methanol solvent, and dried, after which it was transported to a plasma cleaner. In addition, the substrate was cleaned with oxygen plasma for 5 minutes, and then transferred to a vacuum evaporator. On the ITO transparent electrode thus prepared, a compound HI-1 described below was thermally vacuum-deposited in a thickness of 50 Å to form a hole injection layer. A compound HTL was then thermally vacuum-deposited on the hole injection layer in a thickness of 200 Å to form a hole transport layer. Then, the compound of Preparation Example 1-1 previously prepared as a host and a GD compound as a dopant (weight ratio of 9:1) were simultaneously vacuum-deposited to form a light emitting layer having a thickness of 400 Å. Then, the compound of Preparation Example 2-1 previously prepared was vacuum-deposited in a thickness of 350 Å to form an electron transport layer. Then, LiF was vacuum-deposited in a thickness of 10 Å to form an electron injection layer, and aluminum (1000 Å) was vapor-deposited to form a cathode, thereby preparing an organic light emitting device.

An organic light emitting device was prepared in the same manner as described above, except that a material as shown in Table 1 below was used and a light emitting layer and an electron transport layer were used.

An electric current was applied to the prepared organic light emitting device to measure the driving voltage, efficiency, and color coordinate, and the results are shown in Table 1 below.

TABLE 1

| | Material applied | | @ 10 mA/cm² | | | |
|---|---|---|---|---|---|---|
| | Host | Electron transport layer | V | Cd/A | CIE_x | CIE_y |
| Example 1 | 1-1 | 2-1 | 4.0 | 57.3 | 0.354 | 0.353 |
| Example 2 | 1-2 | 2-2 | 3.5 | 58.1 | 0.333 | 0.332 |
| Example 3 | 1-3 | 2-3 | 3.5 | 56.7 | 0.338 | 0.337 |
| Example 4 | 1-9 | 2-4 | 3.4 | 55.4 | 0.338 | 0.337 |
| Example 5 | 1-1 | 2-5 | 4.2 | 55.7 | 0.342 | 0.341 |
| Example 6 | 1-2 | 2-6 | 3.1 | 58.9 | 0.353 | 0.352 |
| Example 7 | 1-3 | 2-7 | 4.3 | 56.0 | 0.330 | 0.329 |
| Example 8 | 1-9 | 2-1 | 3.2 | 57.3 | 0.333 | 0.332 |
| Example 9 | 1-1 | 2-2 | 3.8 | 58.4 | 0.335 | 0.334 |
| Example 10 | 1-2 | 2-4 | 3.9 | 55.0 | 0.337 | 0.336 |
| Example 11 | 1-3 | 2-6 | 4.0 | 56.4 | 0.353 | 0.353 |
| Example 12 | 1-9 | 2-7 | 3.6 | 58.5 | 0.328 | 0.327 |
| Comparative Example 1 | Host 1 | ETL1 | 6.0 | 33.6 | 0.323 | 0.322 |
| Comparative Example 2 | Host 2 | ETL2 | 6.5 | 43.7 | 0.327 | 0.326 |
| Comparative Example 3 | 1-1 | ETL1 | 6.6 | 44.4 | 0.329 | 0.328 |
| Comparative Example 4 | 1-2 | ETL2 | 6.6 | 45.5 | 0.330 | 0.330 |
| Comparative Example 5 | 1-3 | ETL1 | 5.8 | 50.0 | 0.350 | 0.349 |

TABLE 1-continued

| | Material applied | | @ 10 mA/cm² | | | |
|---|---|---|---|---|---|---|
| | Host | Electron transport layer | V | Cd/A | CIE_x | CIE_y |
| Comparative Example 6 | Host 1 | 2-1 | 5.6 | 47.0 | 0.324 | 0.323 |
| Comparative Example 7 | Host 2 | 2-2 | 6.1 | 44.6 | 0.333 | 0.332 |
| Comparative Example 8 | Host 1 | 2-4 | 5.6 | 44.6 | 0.335 | 0.334 |
| Comparative Example 9 | Host 2 | 2-7 | 5.8 | 37.3 | 0.338 | 0.337 |
| Comparative Example 10 | Host 3 | ETL3 | 5.6 | 40.0 | 0.329 | 0.330 |

As shown in Table 1, it was confirmed that the driving voltage of the organic light emitting device according to the present invention was significantly lower than that of Comparative Examples.

[Explanation of Sign]

| | |
|---|---|
| 1: substrate | 2: anode, |
| 3: hole transport layer | 4: light emitting layer |
| 5: electron transport layer | 6: cathode |
| 7: hole injection layer | 8: electron injection layer |

The invention claimed is:

1. An organic light emitting device comprising:
a first electrode;
a hole transport layer;
a light emitting layer;
an electron transport layer; and
a second electrode,
wherein the light emitting layer comprises a compound represented by Chemical Formula 1 and the electron transport layer comprises a compound represented by Chemical Formula 2:

[Chemical Formula 1]

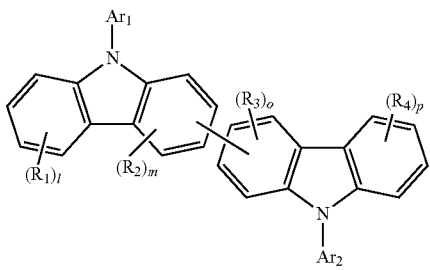

wherein, in Chemical Formula 1,
Ar$_1$ and Ar$_2$ are the same as or different from each other, and each independently a substituted or unsubstituted C$_{6-60}$ aryl,
l and p are each independently an integer of 0 to 4,
m and o are each independently an integer of 0 to 2,
R$_1$ to R$_4$ are the same as or different from each other, and each independently hydrogen; a substituted or unsubstituted C$_{6-60}$ aryl; or C$_{2-60}$ heteroaryl containing one or more heteroatoms each independently selected from the group consisting of N, O and S; or R$_1$ and R$_2$, or R$_3$ and R$_4$ bond to each other to form a substituted or unsubstituted C$_{6-60}$ aromatic ring,

[Chemical Formula 2]

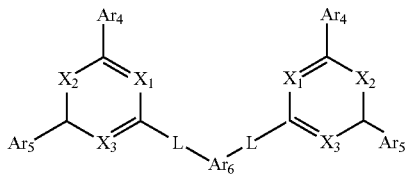

wherein, in Chemical Formula 2,
X$_1$ to X$_3$ are the same as or different from each other, and each independently N, or CH, provided that at least one of X$_1$ to X$_3$ is N,
Ar$_4$ and Ar$_5$ are the same as or different from each other, and each independently a substituted or unsubstituted C$_{6-60}$ aryl; or C$_{2-60}$ heteroaryl containing one or more heteroatoms each independently selected from the group consisting of N, O and s,
each L is the same as or different from each other, and each independently a substituted or unsubstituted C$_{6-60}$ arylene; or C$_{2-60}$ heteroarylene containing one or more heteroatoms each independently selected from the group consisting of N, O, S and P, and
Ar$_6$ is a substituted or unsubstituted C$_{6-60}$ arylene; or C$_{2-60}$ heteroarylene containing one or more heteroatoms each independently selected from the group consisting of N, O and S.

2. The organic light emitting device of claim 1, wherein Ar$_1$ and Ar$_2$ are the same as or different from each other, and each independently phenyl, biphenylyl, naphthyl, phenanthrenyl, or terphenyl.

3. The organic light emitting device of claim 1, wherein R$_1$ to R$_4$ are the same as or different from each other, and each independently hydrogen, or carbazolyl substituted with phenyl.

4. The organic light emitting device of claim 1, wherein the compound represented by Chemical Formula 1 is any one selected from the group consisting of:

1-1

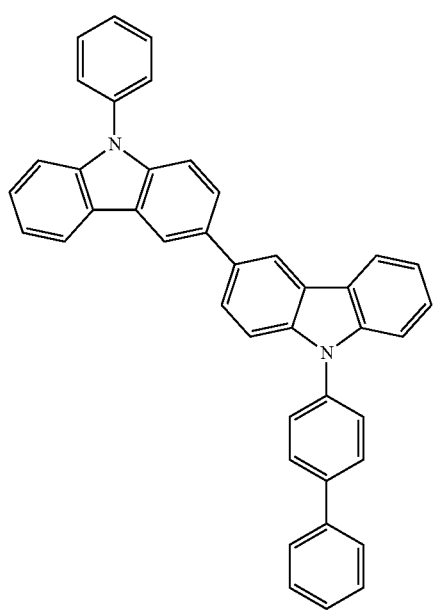

1-2
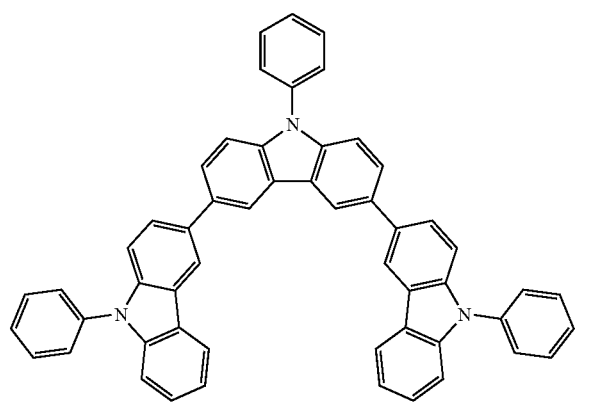
1-3
1-5
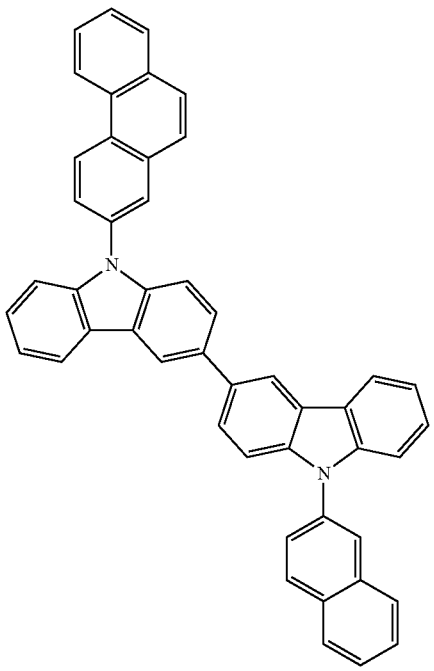
1-4
1-6

1-7
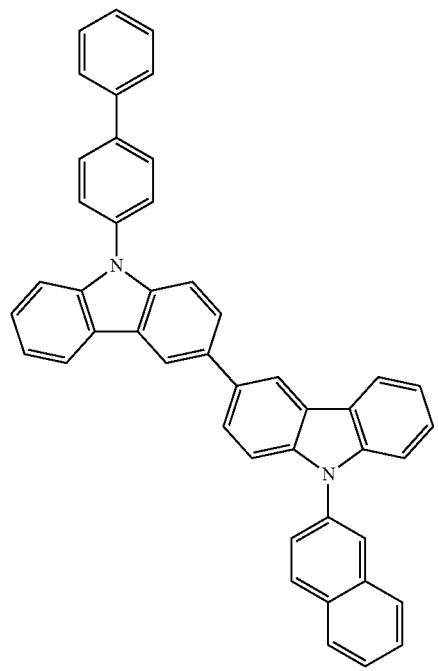
1-8
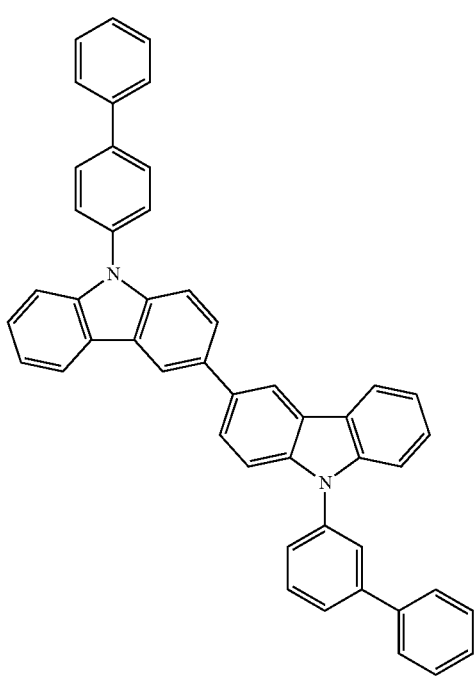
1-9
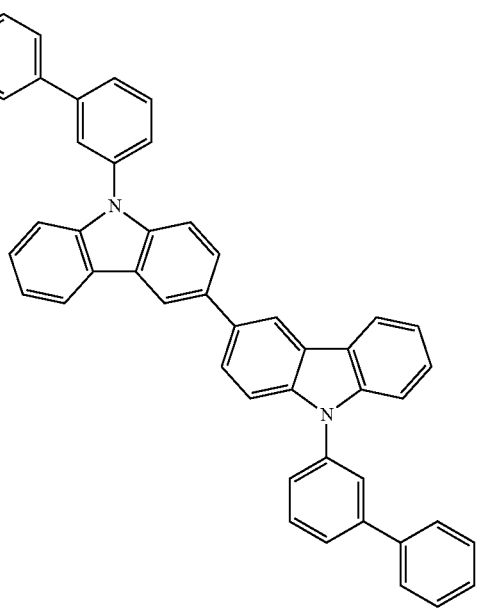
1-10
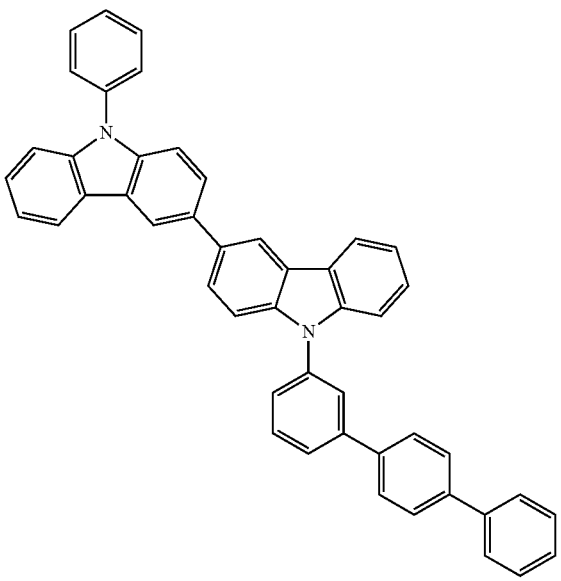

1-11

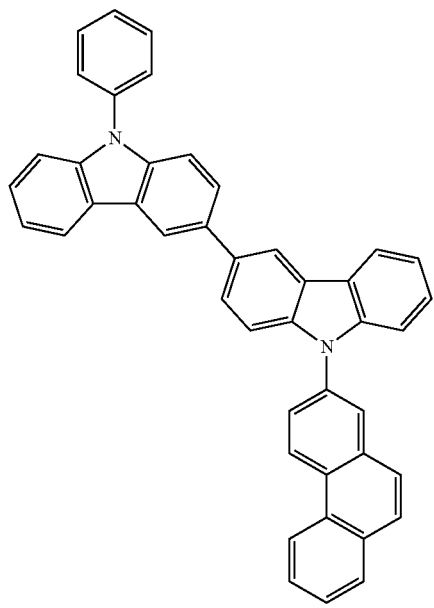

1-12

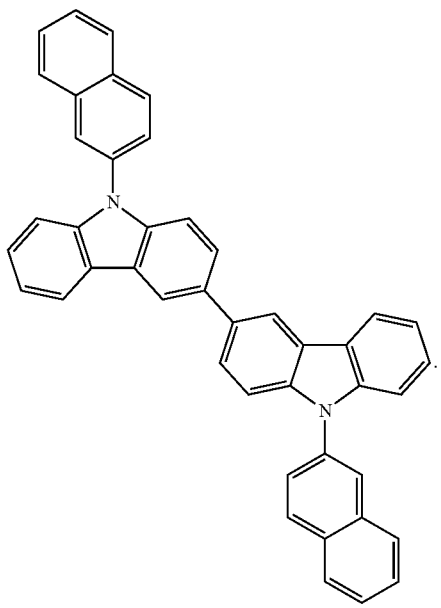

5. The organic light emitting device of claim 1, wherein $X_1$ to $X_3$ are N.
6. The organic light emitting device of claim 1, wherein $Ar_4$ and $Ar_5$ are the same as or different from each other, and each independently phenyl, phenyl substituted with methyl, or naphthyl.
7. The organic light emitting device of claim 1, wherein L is phenylene.
8. The organic light emitting device of claim 1, wherein $Ar_6$, is phenylene, naphthylene, phenanthrenylene, dimethylfluorenylene, dibenzofuranylene, or dibenzothiophenylene.
9. The organic light emitting device of claim 1, wherein the compound represented by Chemical Formula 2 is any one selected from the group consisting of:

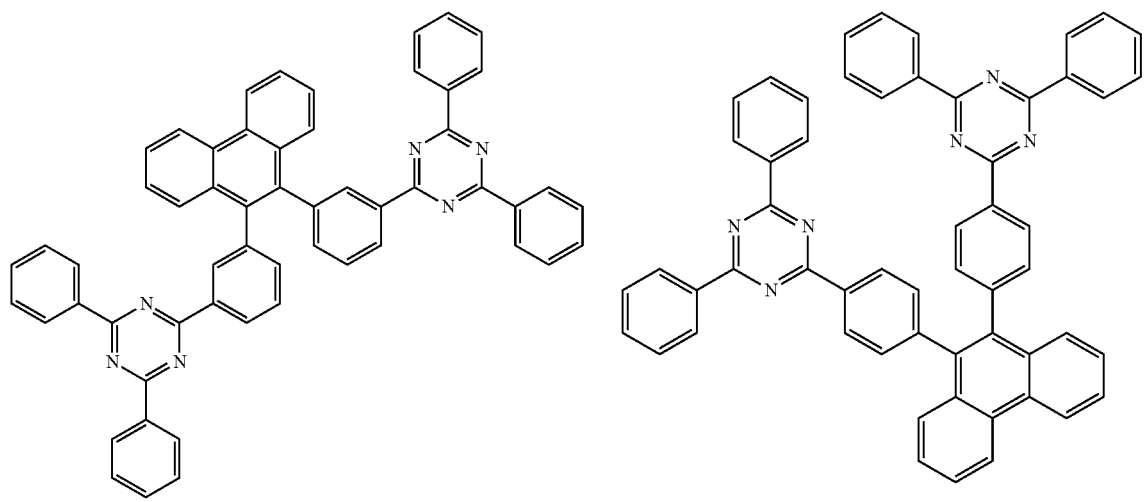

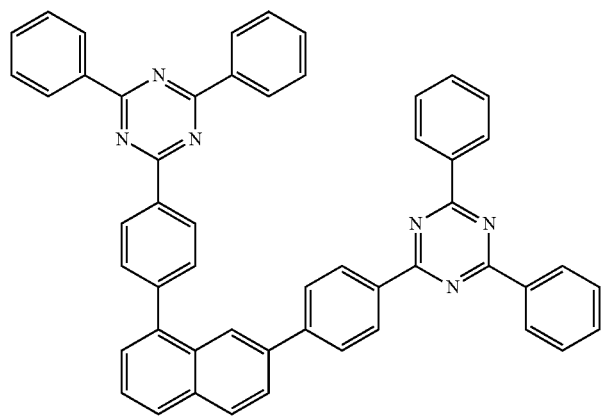
2-3
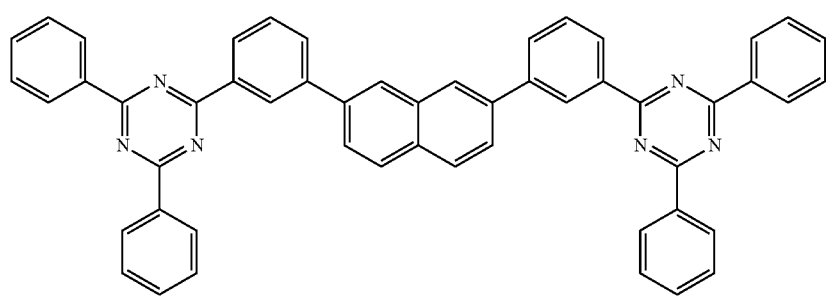
2-4
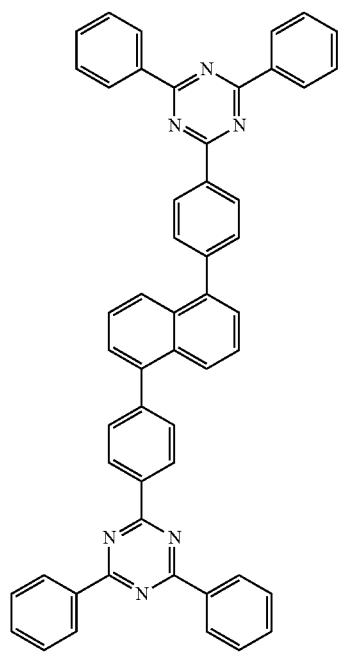
2-5
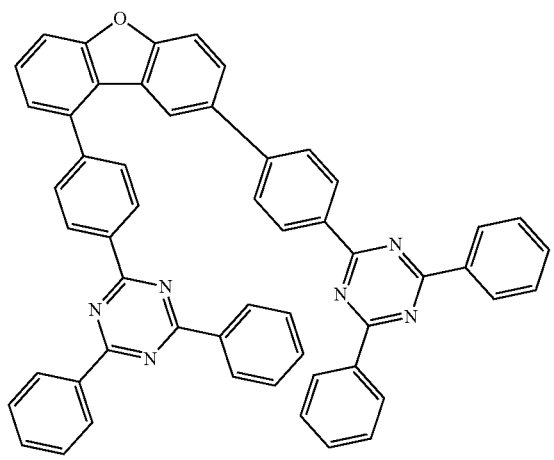
2-6

-continued
2-7
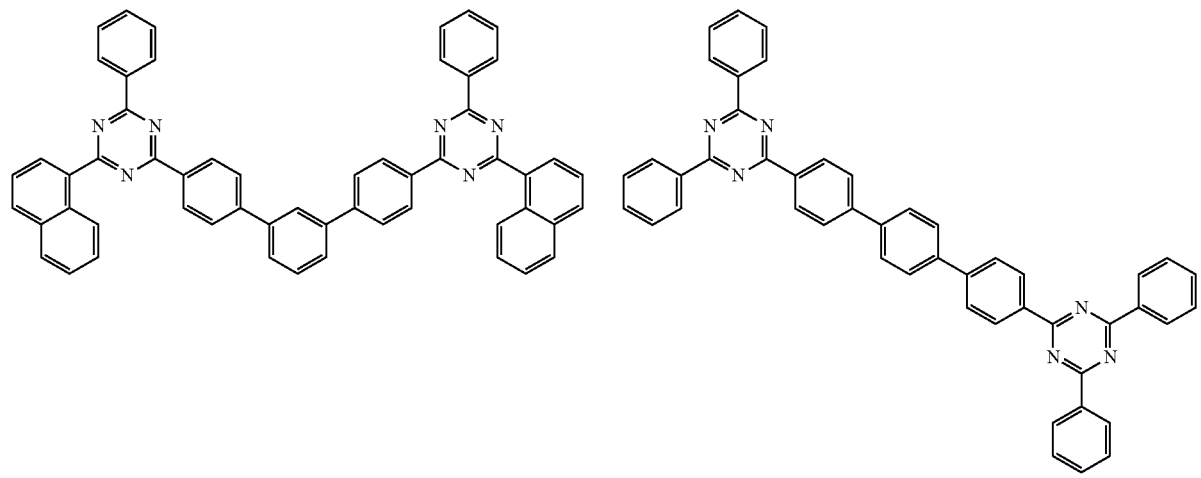
2-8
2-9
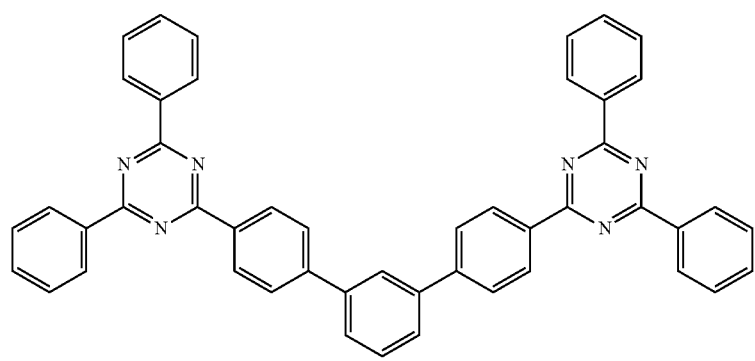
2-10 2-11
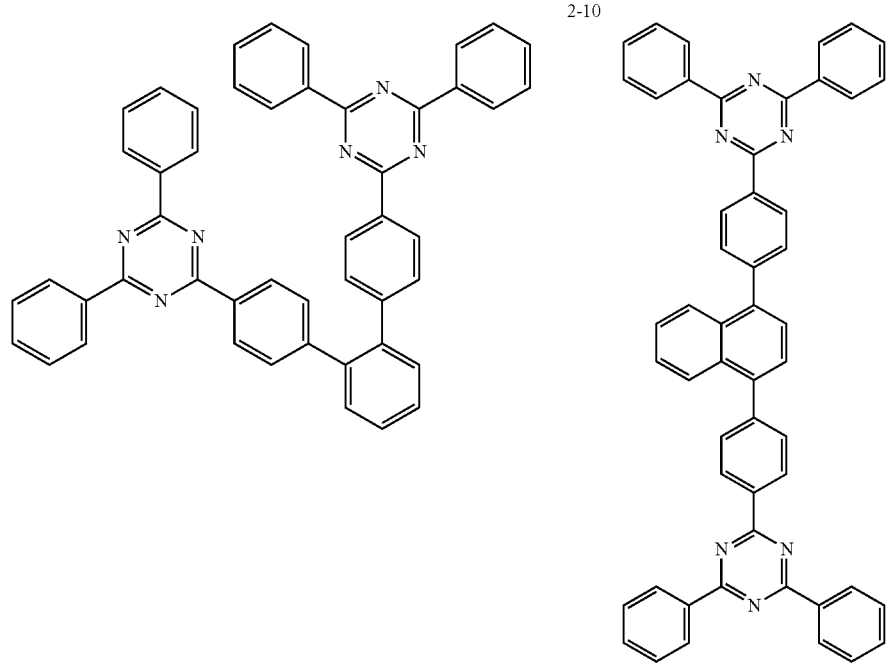

2-12
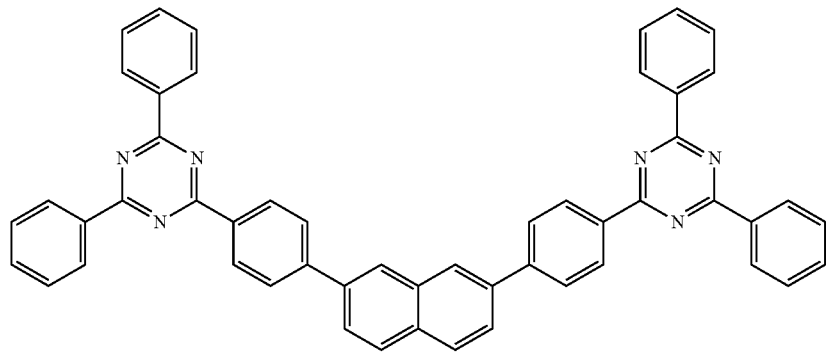
2-13
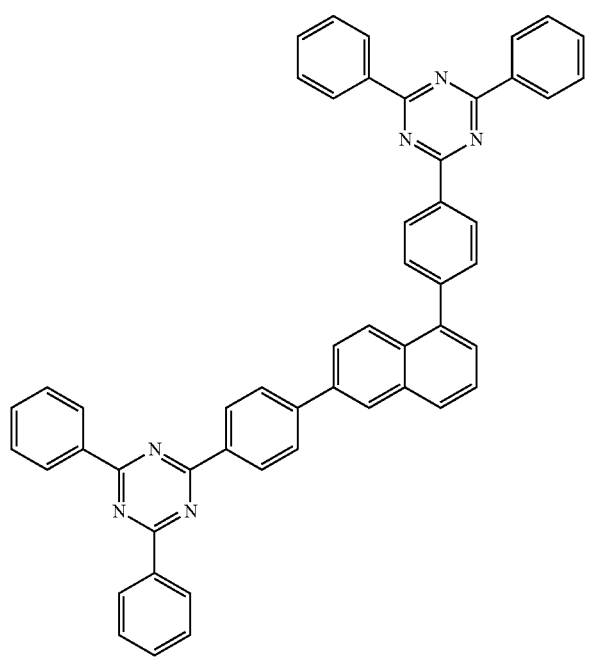
2-14
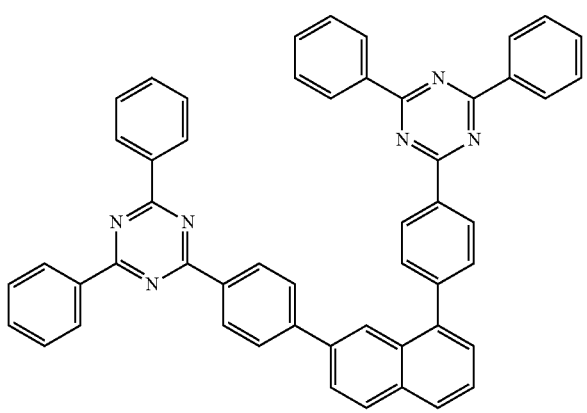
2-15
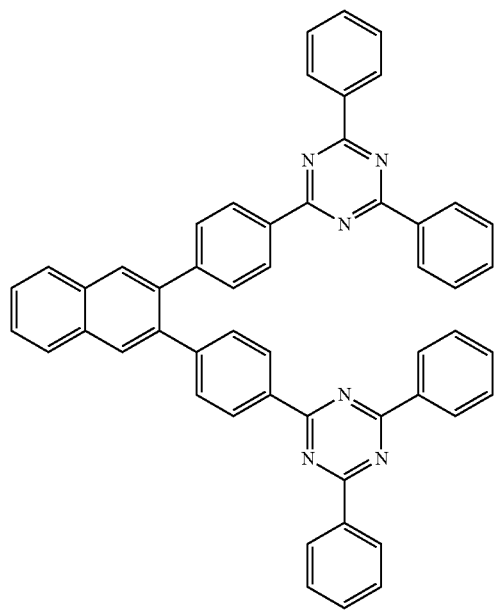

2-16
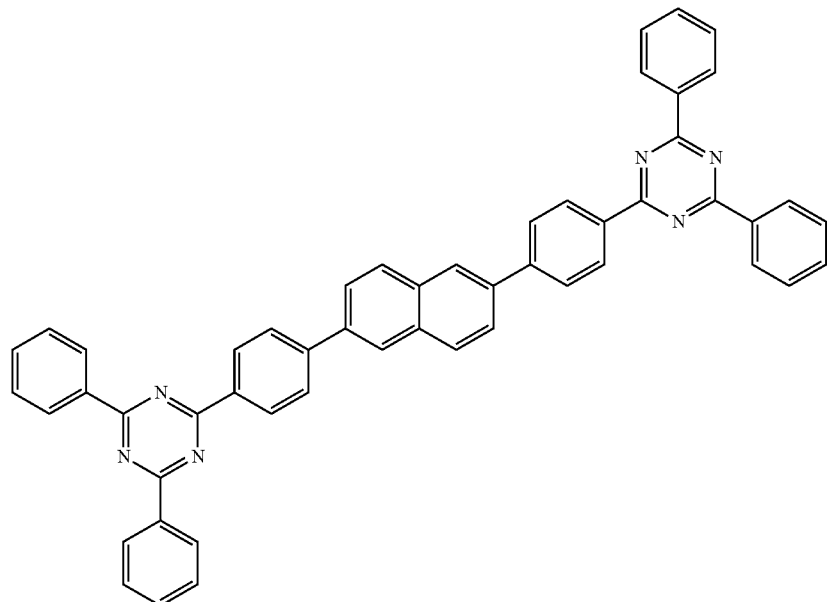
2-17
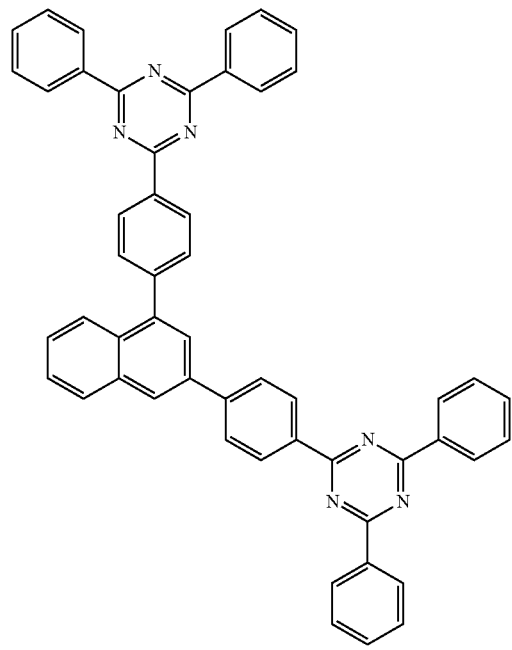
2-18
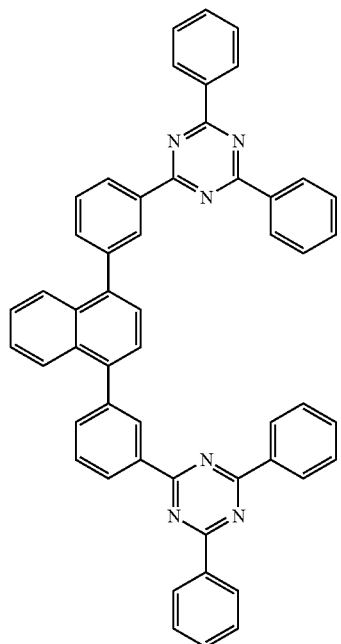

2-19
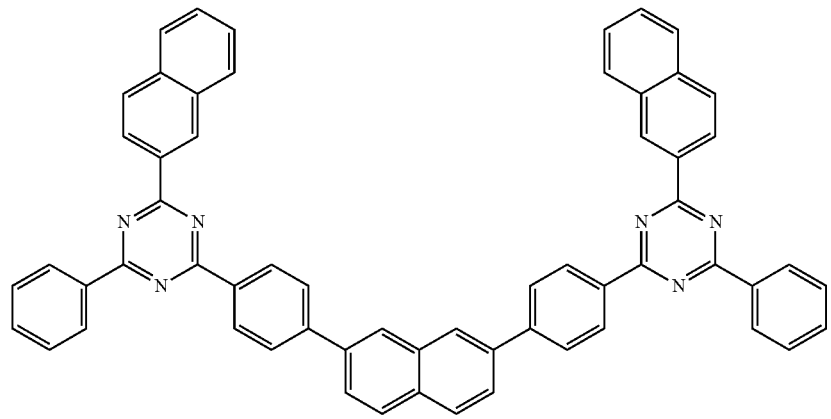
2-20
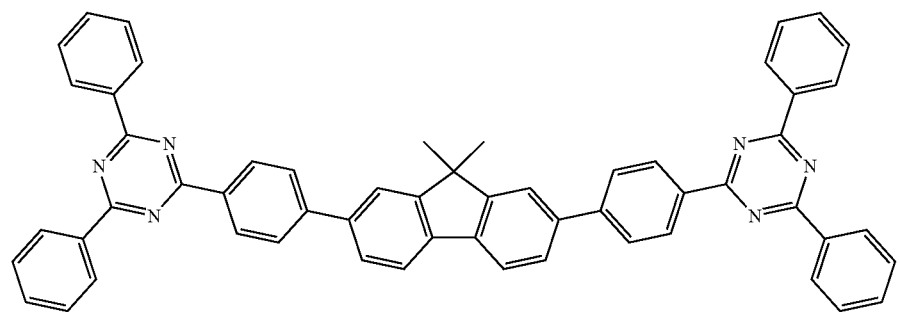
2-21
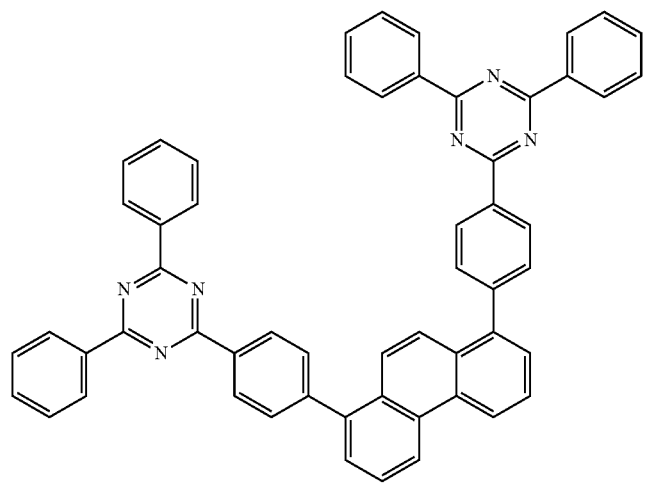
2-22
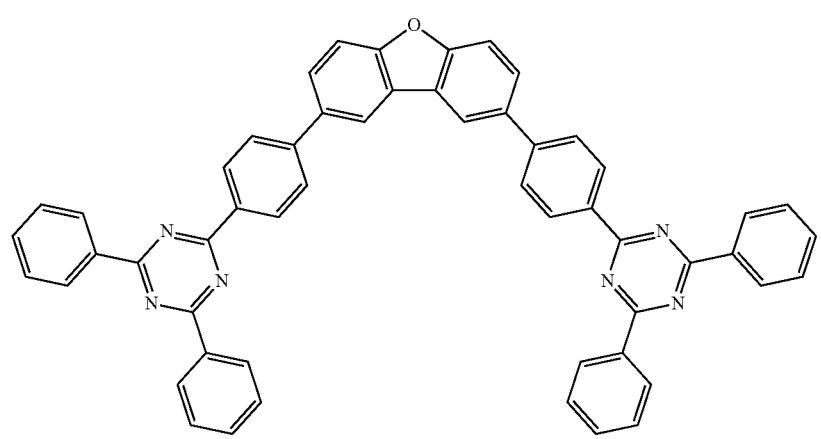

-continued
2-23
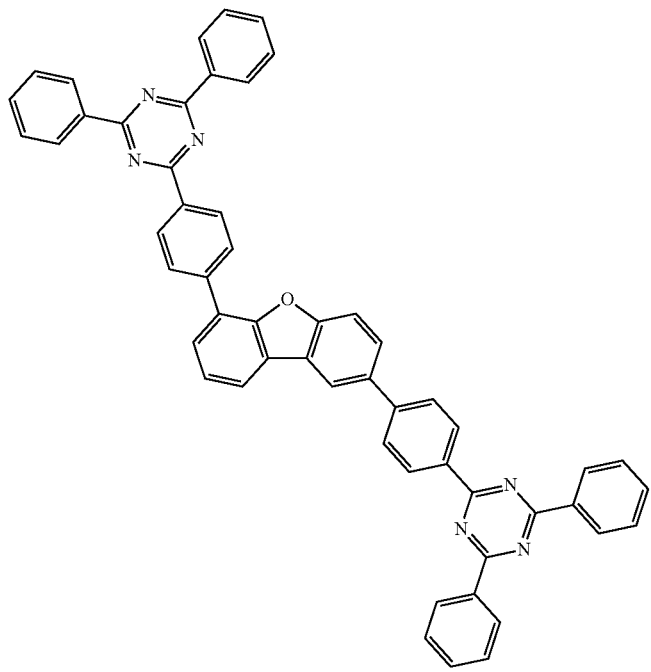
2-24
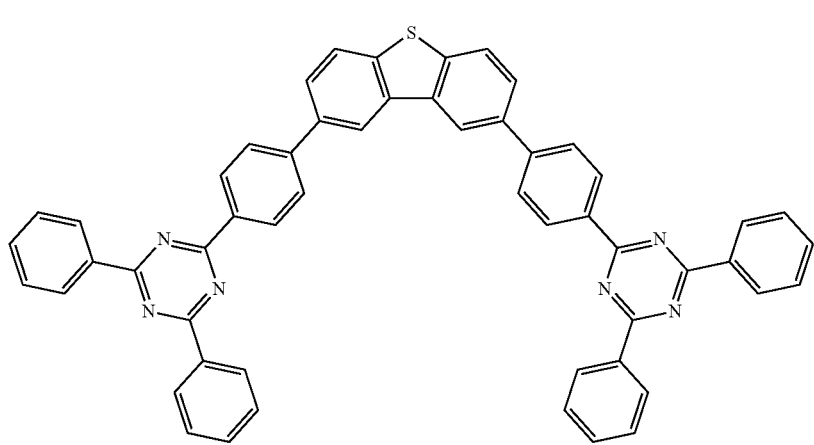

-continued
2-25
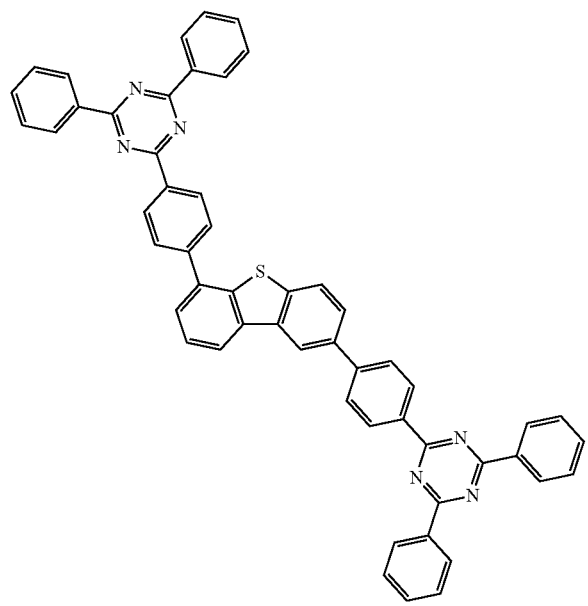
2-26
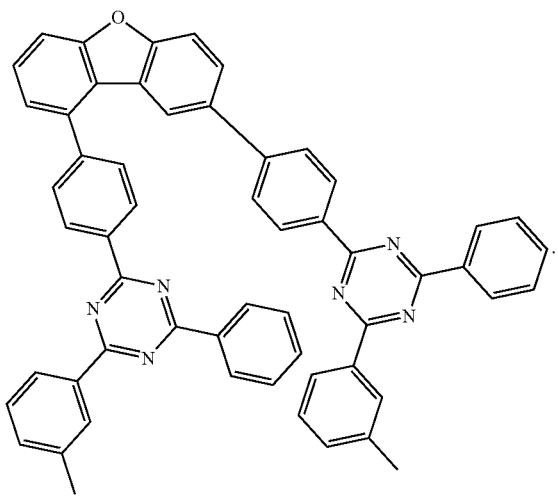
* * * * *